(12) United States Patent
Yerli

(10) Patent No.: US 11,625,884 B2
(45) Date of Patent: Apr. 11, 2023

(54) SYSTEMS, METHODS AND APPARATUS FOR IMPLEMENTING TRACKED DATA COMMUNICATIONS ON A CHIP

(71) Applicant: THE CALANY HOLDING S. À R.L., Luxembourg (LU)

(72) Inventor: Cevat Yerli, Frankfurt am Main (DE)

(73) Assignee: THE CALANY Holding S. À R.L., Luxembourg (LU)

(*) Notice: Subject to any disclaimer, the term of this patent is extended or adjusted under 35 U.S.C. 154(b) by 0 days.

(21) Appl. No.: 16/904,033

(22) Filed: Jun. 17, 2020

(65) Prior Publication Data

US 2020/0402288 A1 Dec. 24, 2020

Related U.S. Application Data

(60) Provisional application No. 62/863,151, filed on Jun. 18, 2019.

(51) Int. Cl.
*G06F 15/16* (2006.01)
*G06T 15/00* (2011.01)
*H04W 4/029* (2018.01)

(52) U.S. Cl.
CPC .......... *G06T 15/005* (2013.01); *H04W 4/029* (2018.02); *G06T 2215/16* (2013.01)

(58) Field of Classification Search
CPC .... G09G 5/363; G09G 5/393; G09G 2360/06; G06T 1/20; G06T 15/005
(Continued)

(56) References Cited

U.S. PATENT DOCUMENTS 6,570,564 B1 5/2003 Sowizral et al.
6,816,750 B1 11/2004 Klaas
(Continued)

FOREIGN PATENT DOCUMENTS

EP 2437217 A2 4/2012
EP 3 556 444 A1 10/2019
(Continued)

OTHER PUBLICATIONS

Office Action dated Mar. 31, 2021, issued in U.S. Appl. No. 16/298,778, filed Mar. 11, 2019, 25 pages.
(Continued)

*Primary Examiner* — Gordon G Liu
(74) *Attorney, Agent, or Firm* — Christensen O'Connor Johnson Kindness PLLC

(57) ABSTRACT

An electronic chip, chip assembly, device, system, and method enabling tracked data communications. The electronic chip comprises a plurality of processing cores and at least one hardware interface coupled to at least one of the one or more processing cores. At least one processing core implements a game and/or simulation engine, at least one processing core implements a position engine, and at least one processing core implements a gyroscope and, optionally, an IMU. The at least one position engine obtains pose data from an external positioning system comprising GNSS augmented by millimeter-wave cellular networks and/or Wi-Fi; and internal pose data from the gyroscope, optional IMU, and game and/or simulation engine, the data comprising inertial, 3D structure, and simulation data, thereby computing a 6 DOF pose of the client device, driving processing of 3D applications by the one or more game and/or simulation engine.

16 Claims, 29 Drawing Sheets

(58) Field of Classification Search
USPC .......................................................... 345/502
See application file for complete search history.

(56) References Cited

U.S. PATENT DOCUMENTS

| | | | |
|---|---|---|---|
| 8,200,594 | B1 | 6/2012 | Bleiweiss |
| 9,443,192 | B1 | 9/2016 | Cosic |
| 2005/0086040 | A1 | 4/2005 | Davis et al. |
| 2005/0128203 | A1 | 6/2005 | Huang et al. |
| 2006/0106591 | A1 | 5/2006 | Bordes et al. |
| 2006/0139358 | A1 | 6/2006 | Cho et al. |
| 2006/0232590 | A1 | 10/2006 | Bakalash et al. |
| 2006/0248543 | A1 | 11/2006 | Jin et al. |
| 2007/0154082 | A1 | 7/2007 | Rhodes |
| 2007/0155506 | A1 | 7/2007 | Malik |
| 2008/0059769 | A1 | 3/2008 | Rymarczyk et al. |
| 2009/0102844 | A1 | 4/2009 | Deparis |
| 2009/0197686 | A1 | 8/2009 | Bergelt et al. |
| 2010/0035637 | A1* | 2/2010 | Varanasi ............ G01C 21/3682 455/457 |
| 2011/0103432 | A1* | 5/2011 | Tangudu ............ H04B 1/70755 375/150 |
| 2011/0167945 | A1 | 7/2011 | Yang et al. |
| 2011/0242427 | A1 | 10/2011 | Ramsdale |
| 2012/0069023 | A1 | 3/2012 | Hur et al. |
| 2014/0161173 | A1 | 6/2014 | Azar et al. |
| 2014/0168236 | A1 | 6/2014 | Keefe et al. |
| 2015/0015253 | A1 | 1/2015 | Mori et al. |
| 2015/0106673 | A1 | 4/2015 | Huang et al. |
| 2015/0251092 | A1 | 9/2015 | Chu et al. |
| 2015/0255131 | A1 | 9/2015 | Byeon et al. |
| 2016/0117152 | A1 | 4/2016 | Baker |
| 2017/0011288 | A1 | 1/2017 | Brothers et al. |
| 2017/0075858 | A1* | 3/2017 | Yerli ..................... G06T 15/005 |
| 2017/0010098 | A1 | 6/2017 | Georgy et al. |
| 2017/0243403 | A1* | 8/2017 | Daniels ................... G06T 19/20 |
| 2017/0323224 | A1 | 11/2017 | Bruestle et al. |
| 2018/0018590 | A1 | 1/2018 | Szeto et al. |
| 2018/0140942 | A1 | 5/2018 | Miller et al. |
| 2019/0205735 | A1 | 7/2019 | Smelyanskiy et al. |
| 2019/0236606 | A1 | 8/2019 | Padmanabhan et al. |
| 2019/0287208 | A1 | 9/2019 | Yerli |

FOREIGN PATENT DOCUMENTS

| | | |
|---|---|---|
| KR | 10-2010-0003518 A | 7/2011 |
| WO | 2014/105865 A1 | 7/2014 |
| WO | 2017/046354 A1 | 3/2017 |
| WO | 2017/086922 A1 | 5/2017 |

OTHER PUBLICATIONS

Extended European Search Report dated Oct. 23, 2020, issued in corresponding European Application No. EP 20180743.5, 9 pages.

Office Action dated Apr. 18, 2017, issued in U.S. Appl. No. 15/047,556, filed Feb. 18, 2016, 27 pages.

Office Action dated Dec. 1, 2017, issued in U.S. Appl. No. 15/047,556, filed Feb. 18, 2016, 26 pages.

Office Action dated Jan. 3, 2019, issued in U.S. Appl. No. 15/047,556, filed Feb. 18, 2016, 37 pages.

International Search Report and Written Opinion, dated Jan. 3, 2017, issued in International Application No. PCT/EP2016/072018, filed Sep. 16, 2016, 25 pages.

Office Action dated Jun. 12, 2018, issued in U.S. Appl. No. 15/047,556, filed Feb. 18, 2016, 41 pages.

Van Lent, M., and J.E. Laird, "Developing an Artificial Intelligence Engine," Proceedings of the Game Developers Conference, San Jose, Calif., Mar. 16-18, 1999, 12 pages.

Carr, N.A., et al., "The Ray Engine," Proceedings of the Acm SIGGRAPH/EUROGRAPHICS Conference on Graphics Hardware, Saarbrucken, Germany, Sep. 1-2, 2002, pp. 1-10.

Crassin, C., et al., "Interactive Indirect Illumination Using Voxel Cone Tracing," Computer Graphics Forum 30(7):1921-1930, 2011.

"Game Engine," Wikipedia, The Free Encyclopedia, Mar. 20, 2013, <https://en.wikipedia.org/w/index.php?title=Game_engine&oldid=545815894> [retrieved Jun. 4, 2014], 8 pages.

Barbic, J., "Multi-Core Architectures," May 3, 2007, https://www.cs.cmu.edu/~fp/courses/15213-s07/lectures/27-multicore.pdf [retrieved Sep. 27, 2019], 67 pages.

Office Action dated Apr. 30, 2020, issued in U.S. Appl. No. 16/298,778, filed Mar. 11, 2019, 21 pages.

Office Action dated Oct. 7, 2019, issued in U.S. Appl. No. 16/298,778, filed Mar. 11, 2019, 18 pages.

Almagbile, A.F.S., "GNSS/INS Integration for Positioning and Navigation: Modelling and Quality Analysis," Doctoral Dissertation, University of Jordan, Amman, Jordan, 2003, 217 pages.

Dupire, J., et al., "Using Game Engines for Non 3D Gaming Applications," Proceedings of the International Conference on Computer Games (CGAMES '05), Angouleme, France, Jan. 2005, pp. 304-307.

Extended European Search Report, dated Sep. 25, 2019, issued in European Application No. 19163040.9, filed Mar. 15, 2019, 10 pages.

"Game Engine," Wikipedia, The Free Encyclopedia, Mar. 10, 2018, <https://en.wikipedia.org/w/index.php?title=Game_engine&oldid=829745391> [retrieved Dec. 9, 2019], 8 pages.

Lucas-Sabola, V., et al., "GNSS IoT Positioning: From Conventional Sensors to a Cloud-Based Solution," IG Inside GNSS, Jun. 15, 2018, <https://insidegnss.com/gnss-iot-positioning-from-conventional-sensors-to-a-cloud-based-solution/> [retrieved Feb. 11, 2019], 33 pages.

An In-Depth Look at Google's First Tensor Processing Unit (TPU), from <cloud.google.com/blog/products/gcp/an-in-depth-look-at-googles-first-tensor-processing-unit-tpu> [retrieved Sep. 16, 2019], 16 pages.

Jouppi, N.P., et al., "In-Datacenter Performance Analysis of a Tensor Processing Unit™," Proceedings of the 44th International Symposium on Computer Architecture (ISCA), Toronto, Canada, Jun. 26, 2017, 17 pages.

"Challenges in GNSS/INS Integration," Thought Leadership Series, articles sponsored by NovAtel Inc., Feb. 11, 2012, 2 pages.

"GNSS IoT Positioning: From Conventional Sensors to a Cloud-Based Solution," <https://insidegnss.com/author/inside-gnss/> Jun. 15, 2018, 33 pages.

Skog, I., "Sensor Fusion GPS+IMU," Module 1—Sensing and Perception, 2016, 9 pages.

Usman, M., et al., "Technologies and Solutions for Location-Based Services in Smart Cities: Past, Present, and Future," IEEE Access, vol. 6, 2018, pp. 22240-22248.

Yin, L., et al., "A GNSS/5G Integrated Positioning Methodology in D2D Communication Networks," IEEE Journal on Selected Areas in Communications 36(2):351-362, Feb. 2018.

Office Action dated Nov. 4, 2021, in European application No. 16 775 106.4, 8 pages.

Office Action dated Nov. 8, 2021, in European application No. 19 163 040.9, 7 pages.

Office Action dated Feb. 8, 2021, issued in Chinese Application No. 201680053259.X, (Chinese version) 10 pages.

Office Action dated May 14, 2021, issued in Chinese Application No. 201680053259.X, (Chinese version) 11 pages.

Office Action dated Aug. 21, 2020, issued in Chinese Application No. 201680053259.X, (Chinese version) 11 pages.

* cited by examiner

SYSTEMS, METHODS AND APPARATUS FOR IMPLEMENTING TRACKED DATA COMMUNICATIONS ON A CHIP

CROSS-REFERENCE TO RELATED APPLICATION

This application claims the benefit of Provisional Application No. 62/863,151, filed Jun. 18, 2019, the entire disclosure of which is hereby incorporated by reference herein for all purposes.

FIELD

Aspects of the present disclosure relate generally to an electronic chip and more specifically to an electronic chip, chip assembly, device, system, and method for use in game and/or simulation applications.

BACKGROUND

Game and/or simulation engines play an increasingly important role in graphics applications. One major task of a software game and/or simulation engine is to provide the most realistic and highest quality of graphics possible at a real-time performance comprising other features such as simulation capabilities. A software game and/or simulation engine is typically provided as computer-executable code that is executed on a CPU. For example, the game engine and/or simulation may typically run on a processor or microprocessor of a computing device, such as a CPU of a personal computer, a console, a mobile phone or a tablet. Hence, performance of the CPU may determine the performance of a software game and/or simulation engine. The software game and/or simulation engine may also access a graphics processing unit GPU. For example, the GPU can render lists of individual objects with a very high performance to graphics memory or video memory. A computer graphics scene may include a large number of objects with characteristics related to their 3D position and 3D orientation, behavior, material properties and the like. In order to achieve highly realistic scenes, the game and/or simulation engine needs to consider the whole scene, which may often contain millions of objects that are to be rendered to the screen. For example, the game and/or simulation engine may consider the behavior and interaction of light with individual objects and between the objects of the scene.

These game and/or simulation engines offer an environment created specially to implement the functionalities that are specific to 3D video games and real-time simulations. Thus, game and/or simulation engines enable implementation of aspects such as the management of an animated model, the collisions between objects, and the interaction between the player and the game. Many recent games, simulations and serious games use engines that go beyond visual and interaction aspects. For example, programmers can rely on a physical engine to simulate physical laws within the virtual environment, an audio engine to add music and complex acoustical effects, and an artificial intelligence (AI) engine to program non-human players' behaviors. Properties expected for a 3D interface are very close to the ones for 3D video games. Thus, game and/or simulation engines may be used in any type of application that requires rendering of 3D graphics at a real-time performance, including applications in digital realities such as Virtual Reality (VR), Augmented Reality (AR), Mixed Reality (MR), or combinations thereof.

Providing high-quality digital reality experiences through game and/or simulation engines requires accurate position and orientation tracking of the users in order to correctly render and position each of the 3D objects in the user's field of view and to precisely provide location-based services and content. Tracking can be performed through a variety of techniques, such as through Global Navigation Satellite Systems (GNSS), which refers generally to any satellite-based navigation systems like GPS, BDS, Glonass, QZSS, Galileo, and IRNSS. Using signals from a sufficient number of satellites and techniques such as triangulation and trilateration, GNSS can calculate the position, velocity, altitude, and time of devices. GNSS can be further augmented in order to correct errors such as multipath errors, orbit errors and satellite clock errors. Typical methods include placing a reference station at a precisely known location in the vicinity of a user, or where high-accuracy navigation is required. The reference station measures the ranges to each of the satellites in view, demodulates the navigation message, and depending on the type of parameter, computes several types of corrections to be applied by the user's receiver in order to improve its performance. Then the station broadcasts its corrections to local users via a data link, so that position accuracies of a few centimeters are obtained.

The main augmentation systems currently available are differential GPS (DGPS), satellite-based augmentation systems (SBASs), real-time kinematic (RTK) systems, and assisted GNSS (AGNSS). From the mentioned augmentation methods, AGNSS is the only one that does not require the deployment of a specific terrestrial network of reference stations, and rather exploits the network architecture of existing cellular communication systems to assist GNSS. These methods have some limitations, such as the availability of a sufficient number of satellite signals, or the fact that satellite signals can be blocked inside buildings, tunnels, or other solid structures. Furthermore, these methods are prone to suffer interruptions in the position information.

Other complementary methods are sometimes used, such as inertia navigation systems (INS). Since an INS is self-contained, i.e., they do not rely on any external information sources that can be disturbed or jammed, representing an attractive means of navigation for many applications where 100% coverage and a high continuity-of-service is needed. Further, INS also provides a full 6 degrees-of-freedom (DOF) navigation solution and generally has a high update rate (≥100 Hz). Accordingly, after the position of a system is initially determined, the INS sensors allow the position and orientation to be determined as the system moves, even if the satellite signals are blocked. The determination of the position based on measuring the system's movement is known as dead reckoning (i.e. inertial navigation). The accuracy of a dead reckoning position and how long it remains accurate depends on various factors such as the quality of the sensors and how well they are calibrated. In some systems dead reckoning is also used to improve the accuracy of the satellite location determinations. Sensor fusion of GNSS or any of the augmented GNSS systems with INS is typically based on the Extended Kalman Filter (EKF), which uses algorithms to combine the absolute positioning of GNSS and the relative positioning of INS sensors, and in some cases, other sensors such as radars and cameras, in order to calculate a relatively accurate 6 degrees of freedom (6 DOF) position and orientation of devices.

Other advances in positioning technology comprise potential implementations of 5G wireless networks and their millimeter-wave (mmW) transmissions in this field. Through estimates via methods such as time of arrival (ToA), angle-of-arrival (AoA) and angle-of-departure (AoD), cm accuracy can be reached. However, high-end 3D applications may require even higher accuracy levels.

Therefore, technological developments that can provide more precise and stable levels of positioning suitable for high-end 3D applications or simulations are required.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

One or more problems disclosed herein, or other technical problems, are solved by embodiments of an electronic chip, chip assembly, device, system, and method enabling tracked data communications for use in game and/or simulation applications.

As used in the current disclosure, "positioning" is the process of determining the location (e.g., geographical location) of a device, such as a mobile phone, laptop, tablet computer, a personal digital assistant (PDA), drones, vehicles, head-mounted displays (HMDs), consoles, smart contact lenses, etc. Once the coordinates of a device have been established, they can be mapped to a location and then delivered back to the requesting service. The mapping function and the delivery of location information are part of location services (LCS)—which, for example, emergency services depend on. Services that use location data are referred to as being location-aware, and customer services that offer added value by being location-aware are known as location-based services (LBSs). As the use of 3D applications is becoming more widespread, positioning technologies have also advanced to be able to determine and track six degrees of freedom (6 DOF) of devices, which refers in some embodiments to the forward/backward (surge), up/down (heave), left/right (sway) translation in three perpendicular axes, combined with changes in orientation through rotation about three perpendicular axes, often termed yaw (normal axis), pitch (transverse axis), and roll (longitudinal axis).

As used in the current disclosure, "availability" refers to the percentage of the time a system is able to provide the user with navigation solutions at a desired level. "Accuracy" is a measure of how close the estimated or measured position at a given time to the truth. "Reliability" is the ability of the system to detect errors (outliers) at certain magnitude and estimate the effect of undetected errors on the navigation solutions. "Integrity" refers to the ability of the system to send a warning message to the user when the system should not be used for positioning.

A first aspect of the current disclosure includes a data tracking communications chip. The data tracking communications chip tracks data that allows determining precisely where a client device containing the chip is and also enables communication of the client device with other devices. In the first aspect, the chip comprises a plurality of processing cores; and at least one hardware interface coupled to at least one of the plurality of processing cores, wherein at least one of the plurality of processing cores implements a first engine (e.g., one or more game engines and/or simulation engines), wherein at least one of the plurality of processing cores implements at least one position engine, and wherein at least one of the plurality of processing cores implements at least one gyroscope core.

The position engine implemented in the at least one processing core is configured to gradually obtain and fuse position and orientation data from different sources obtained through a plurality of methods, and therewith compute a highly accurate 6 DOF position and orientation of a client device including a data tracking communications chip. Each position computation/refinement iteration requested and implemented by the position engine provides a further layer of accuracy to the actual position of a client device implementing the data tracking communications chip.

In some embodiments, the position engine may first obtain data from one or more systems within an external positioning system that can provide data through dedicated hardware (e.g., receivers or transceivers) on the on-chip position engine or via the one or more hardware interfaces. In a further embodiment, the position engine further obtains position and orientation data from an internal positioning system, which can provide a further layer of accuracy to the position and orientation of the client device implementing the data tracking communications chip. The external positioning systems refer to systems that can send data from external sources directly to the position engine or via the one or more hardware interfaces, and which are not integrated in the data tracking communications chip. The external positioning system may comprise, for example, global navigation satellite systems (GNSS), cellular networks, and short range communication systems. The internal positioning systems refer to systems that are integrated in the data tracking communications chip or which can be computed through software utilizing data stored in the data tracking communications chip or to which the data tracking communications chip may have access (e.g., stored and computed or partially computed on a server).

The GNSS systems comprised in the external positioning system include satellites used for global positioning of devices. Employing signals from a sufficient number of satellites and techniques such as triangulation and trilateration, GNSS can calculate the position, velocity, altitude, and time of devices. The GNSS may comprise one or more of several satellite systems, such as GPS, BHS, Glonass, QZSS, Galileo, and IRNSS. The GNSS systems may comprise a constellation of satellites equipped with at least one atomic clock, radio receivers and transmitters, special antennas, one or more computers and small thrusters used for course corrections. GNSS systems may comprise a control segment and a user segment. The control segment comprises global ground stations that track the satellites and then send commands and data to the constellation such as corrected orbital and time information, so that they ensure a continuous operation of the space segment. The user segment comprises receiver equipment and computational techniques to calculate the position, velocity, and time (PVT) data of a client device, which are performed by the data tracking communications chip.

The cellular networks comprised in the external positioning system may include existing cellular networks architecture such as mmW antennas from, for example, a 5G network, or is further supported by a 4G cellular communications network. In some cellular network embodiments, the mmW band, also called the extremely high frequency band, is employed. The mmW band spans from 30 to 300 GHz, however, neighboring super-high frequencies from about 10 to 300 GHz may also be included, since these waves propagate similarly to mmW. Mmw-based antennas or combinations of mmW-based antennas and sub GHz antenna systems, because of the extremely high frequency of mmW, are highly reflective, being easily blocked by walls or other solid objects, and may suffer significant attenuation passing through foliage or in tough weather conditions. Therefore, the cellular network antennas may include small, mmW transceivers arranged in a grid pattern, which can help to magnify the collective energy, increase gain, and decrease power losses without increasing transmission power. Techniques known in the art, such as multiple-input, multiple-output, or MIMO, may be used to separate beams at several devices simultaneously or send multiple data streams to a single device, thereby increasing quality of service (QOS). Additionally, the antennas may cover relatively small areas between about 100 meters to about 2 km to ensure accurate propagation of the millimeter waves.

The short range communication systems comprised in the external positioning system may include Wireless Local Area Networks (WLAN), such as WLAN marketed under the Wi-Fi brand name, or through Personal Area Networks (PANs), such as PANs marketed under the Bluetooth, ZigBee and ultrawideband (UWB) standards.

The internal positioning system comprises sensor data such as inertial data, and virtual world system computations data comprising 3D structure data and simulation data.

In one embodiment, the at least one position engine implemented in one or more of the processing cores obtains positioning data from the GNSS and computes, through hardwired algorithms (e.g., triangulation or trilateration), the initial respective position of a client device comprising the data tracking communications chip. The positioning data obtained via GNSS can refer to position, velocity and time (PVT) data. The positioning data obtained by the position engine from the GNSS can be used by the data tracking communications chip to compute an initial position of the client device, which can be further refined through other methods of the current disclosure. As known in the art, positioning only through GNSS can sometimes be weak or insufficiently accurate in complicated environments, such as urban areas and inside buildings. Therefore, the data tracking communications chip further augments the initial position by positioning data sent wirelessly by a cellular positioning system connected to the chip via the at least one hardware interface. Positioning data refinement via the cellular positioning may be performed by a communications unit connected to the data tracking communications chip via the one or more hardware interfaces via methods such as time of arrival (ToA), angle-of-arrival (AoA) and angle-of-departure (AoD).

In a further embodiment, for positioning in short-range or indoor situations, the positioning data can be further augmented by positioning data from short range communication systems, such as WLAN and PANs. In other embodiments, the refined positioning data can be further augmented by orientational data obtained by the at least one position engine via the one or more gyroscopes, enabling the position engine to compute a 6 DOF position and orientation of the respective client device.

In alternative embodiments, the GNSS is augmented via other techniques known in the art, such as via differential GPS (DEPS), satellite-based augmentation systems (SBASs), real-time kinematic (RTK) systems.

In further embodiments, the 6 DOF position and orientation obtained through one or more of the methods above can be further augmented by a 3D structure of real world objects stored in a virtual world system stored and computed on a server; by simulation data from the game and/or simulation engine; or combinations thereof. The virtual world system comprises the digital version of the real-world, including real-world coordinates, such as position, orientation, scale and dimension of real-world objects, the physical properties, and the 3D structure of each of the real objects in the form of real-time 3D virtual replicas. 3D applications that are processed by the game and/or simulation engine are thus positioned within the virtual world system relative to the virtual replicas of the real world.

Thus, using the positioning from the GNSS and further refining the data with one or more of a plurality of other methods, the hardwired position engine may compute a 6 DOF position and orientation of a client device implementing the chip. The 6 DOF position and orientation are thereafter used by the game and/or simulation engine in order to drive the operations of 3D applications thereon executed, such as for accurately rendering 3D content in the field of view of a user. The 6 DOF position and orientation may alternatively be shared with other systems.

In an illustrative embodiment, the position engine is configured to obtain first positioning data from a global navigation satellite system (GNSS) and compute, through one or more hardwired algorithms, an initial position and orientation of a client device. The position engine is further configured to augment the initial position and orientation based on second positioning data received from a cellular positioning system via the at least one hardware interface, based on third positioning data received from one or more short range communication systems, and based on orientational data received from one or more gyroscopes. The position engine is further configured to perform virtual world system computations, obtaining a refined 6 degrees of freedom (6 DOF) position and orientation, which can be used in operations of 3D applications executed by one or more game engines and/or simulation engines on the chip. In an embodiment, at least one of the plurality of processing cores implements a communications engine, and the second positioning data and the third positioning data are received via the communications engine.

The level of accuracy required by the data tracking communications chip, and thus the number of position and orientation refinement iterations performed by the position engine, may depend on the type of application that may require the positioning services. For example, applications related to the medical field or autonomous driving may, where the human life might be at stake, may require a higher level of accuracy than applications related to video games or entertainment. However, in all embodiments provided, the position and orientation computed by the position engine may be provided at a continuous rate. Hence, in some embodiments of the current disclosure, the different positioning systems used to provide the position engine to compute a highly accurate 6 BOF position and orientation of client devices are configured to implement different, complementary positioning update rates, that may serve to compensate for periods in which normally there would be a lack of positioning data, improving the percentage of availability, integrity, continuity and accuracy of the positioning, depending on the situation and priorities of the application. Furthermore, the integration of a plurality of positioning methods obtaining data from a plurality of sources complements errors typical from each system and, in case of failure from one system, the data tracking communications chip can activate one or more of the remaining systems to supply for this failure.

The verb "implement" as used throughout this application is directed at an implementation in hardware. Hence, a processing core may include a plurality of electronic circuits that are configured to realize the plurality of functionalities of at least one component herein described. The one or more processing cores of the electronic chip should not be interpreted as a central processing unit that can execute instructions of the at least one component (e.g., software game and/or simulation engine, position engine, gyroscope, etc.). Rather, the one or more processing cores are a dedicated electronic circuitry implementing or realizing the functionality of the at least one component in hardware. Hence, the game and/or simulation engine may also be referred to as a hardware game and/or simulation engine or as a hardwired game and/or simulation engine or as an on-chip game and/or simulation engine. The position engine can also be referred to as a hardware position engine, a hardwired position engine, or as an on-chip position engine. Likewise, the gyroscope can be referred to as a hardware gyroscope, a hardwired gyroscope, or as an on-chip gyroscope. Accordingly, the electronic chip may be referred to as an Engine on Chip (EOC) or Engine Processing Unit (EPU). The processing cores may implement the one or more components as a plurality of hardwired electronic circuits implementing respective functionalities, which may be arranged or assembled according to any suitable production process. Furthermore, a configured field programmable gate array (FPGA) could be used to implement the game and/or simulation engine, the position engine, or both, in hardware. The electronic chip may be provided as an integrated circuit that integrates all components and functionality of the hardwired game and/or simulation engine and position engine into a single chip or a plurality of chips. The same principle may be applied to other on-chip components described in other embodiments of the current disclosure.

The processing cores of the electronic chip may be regarded as functional units or modules of the electronic circuits of the electronic chip. For example, at least one of the one or more processing cores may be realized as a FPGA or any other form of an integrating circuit implementing a dedicated functionality. Accordingly, the electronic chip includes at least one integrated circuit realizing at least some of the one or more processing cores. Wherein at least one of the processing cores implements the hardwired game and/or simulation engine, wherein at least one of the processing cores implements the position engine, and wherein at least one of the processing cores implements a gyroscope.

The at least one hardware interface enables a direct interaction with the one or more processing cores. The hardware interface may be realized as a part of the at least one integrated circuit of the electronic chip. However, the hardware interface may also be realized as one or more further integrated circuits providing the functionality of interfacing the processing cores. For example, the hardware interface may enable an external cellular positioning system to provide communications to the chip, and also to provide cellular tracking data as input data to refine the positioning of the client device comprising the one or more chips.

The at least one gyroscope core may be a microelectromechanical systems (MEMS) gyroscope, which may be suitable to be manufactured as a processing core on integrated circuits such as on an electronic chip from embodiments of the current disclosure. MEMS are Microscopic devices made up of components between 1 and 100 micrometers in size (i.e., 0.001 to 0.1 mm), and MEMS devices generally range in size from 20 micrometres to a millimetre (i.e., 0.02 to 1.0 mm). A MEMS gyroscope uses the principles of vibrating structure gyroscopes, which uses a vibrating structure to determine the rate of rotation. The underlying physical principle is that a vibrating object tends to continue vibrating in the same plane even if its support rotates. The Coriolis effect causes the object to exert a force on its support, and by measuring this force the rate of rotation can be determined. MEMS gyroscopes can use lithographically constructed versions of one or more mechanisms such as tuning forks, vibrating wheels, or resonant solids of various designs known in the art.

The position engine may utilize algorithms such as the Extended Kalman Filter (EKE) to combine the absolute positioning of the external positioning system and the relative positioning of the gyroscope and thus obtain very low-error, highly-accurate 6 DOF position and orientation of the devices implementing the one or more data tracking communications chip. A Kalman Filter, also known as linear quadratic estimation (LQE), is an algorithm that uses a series of measurements observed over time, comprising statistical noise and other inaccuracies, and produces estimates of unknown variables that tend to be more accurate than those based on a single measurement alone, by estimating a joint probability distribution over the variables for each timeframe. For example, the position engine may use tightly coupled GNSS/INS integration algorithms based on merging the raw GNSS data with raw gyroscope (or other INS system) data. The raw GNSS observations, such as pseudorange and carrier phase, can be used for such integration. Thus, the position engine may be considered as an on-chip, hardwired fusion sensor core configured to implement position and orientation hardwired algorithms from a plurality of data sources for fusing the positioning data and obtaining a highly accurate 6 DOF position and orientation for use by the hardwired game and/or simulation engine during operation of 3D applications or for sharing with other systems.

The hardwired game and/or simulation engine is configured to perform one or more tasks on input data thereby generating data sets. The hardwired game and/or simulation engine may be implemented on a core that implements hardwired algorithms and code functions, which may be applied to data. This may enable faster graphics or simulation results in 2D, 3D or 4D (3D+time) even for stereo displays. The input data may be input by a user through suitable programming interfaces, captured by one or more external sensing mechanisms communicatively connected to the electronic chip via the at least one hardware interface, or any combination thereof. The sensing mechanisms may include, without limitations, optical sensors, inertial sensors, or combinations thereof. The input data may include one or more of an image data, 3D geometries, video data, audio data, textual data, haptic data, time data, position and orientation data, or any combination thereof. In some embodiments, the hardwired game and/or simulation engine receives the 6 DOF position and orientation data from the position engine, and proceeds to use this data during the processing of the 3D applications. For example, media streams from AR or VR video games requiring a highly accurate position and orientation of a user can be provided so that each one of the objects in the field of view of the user are accurately rendered with respect to the position and orientation of the user, independent of being indoors or outdoors.

In some embodiments, the one or more tasks performed by the hardwired game and/or simulation engine on the input data may be defined by and reflect the functionality of the game and/or simulation engine. The electronic chip may expose an interface for controlling the game and/or simulation engine according to its functionality. In some embodiments, the one or more tasks may be initiated via the interface of the on-chip game and/or simulation engine. The one or more tasks may be performed in real-time during the programming of a video game or other application, but may also be performed during application run-time (i.e., the actual real-time execution of the application by a user), whereby the game and/or simulation engine may process data in real time. In yet another embodiment, the one or more tasks include one or more of determining how objects cast shadows over other objects, determining how objects are reflected in other objects, or determining how the light falling on one object illuminates other surrounding objects. In addition or as an alternative, the game and/or simulation engine may perform other and further tasks, including tasks directed at simulation and/or rendering of graphics scenes, such as a simulation of individual objects of the graphics scene, a determination of characteristics of objects of the graphics scene, rendering of one or more of the objects of the graphics scene, and the like. The game and/or simulation engine may further obtain a client device position and orientation data from the position engine in order to simulate said position and orientation data, or to further predict the position and orientation in the near future of the client device. An example of this embodiment may be, the simulation engine may be used in a chip implemented in a self-driving vehicle or drone in order to predict their immediate path. The prediction may be performed by obtaining the current position, orientation, speed and acceleration of the self-driving vehicle or drone and using these data to interpolate their immediate path.

In addition or as an alternative, the game and/or simulation engine may perform one or more of viewport culling and coverage (z-) buffer culling to determine visibility of objects, voxelization of a scene as a preparation step for global illumination calculations, sparse voxel-based cone tracing for global illumination, muscle fiber mechanics and musculoskeletal skinning, finite element methods for biomechanical muscle modelling, fluid dynamics using SPH (smoothed-particle hydrodynamics) for realistic effects involving water volumes, volcanic lava volumes, and astrophysical effects, which may be related to surfaces of stars, real-time Eulerian water simulation, or realistic vegetation dynamics, and the like, in any combination.

According to an embodiment, the data tracking communications chip further comprises a memory configured to store data and to provide the data to one or more processing cores. For example, the position engine may store position and orientation data in the memory for the game and/or simulation engine to retrieve the data from the memory and thereafter use the data during 3D application task processing. A register or a register set may be used to control properties of the memory, to indicate characteristics of the stored data and/or to control operation of the one or more processing cores. In other embodiments, the data may be stored in an external main memory of the host system, which may be accessible via one or more ports of an on-chip memory controller.

In an alternative embodiment, the one or more processing cores implements one or more CPUs configured to assist in processing of game engine and/or simulation data and client device position and orientation computations. Hence, the at least one processing core may be an electronic circuitry that carries out instructions of a computer program by performing basic arithmetic, logical, control and input/output (I/O) operations. The functionality of the central processing unit may be the same or similar to that of existing CPUs. The central processing unit may allow an execution of software according to an instruction set architecture directly on the electronic chip. The software may be dedicated to processing of the game and/or simulation engine and/or position engine. However, it is to be understood that the central processing unit is not restrictive to processing of the game and/or simulation engine and position intelligence engine only but may, rather, execute any kind of software which may exploit the functionality of the electronic chip. The electronic circuitry may include at least one respective microcontroller, microprocessor or digital signal processor (DSP) on the single electronic chip in any combination. In order to enable operation of the central processing unit, the electronic chip may further comprise memory blocks, such as a selection of ROM, RAM, EEPROM and/or flash memory, timing sources including oscillators and phase-locked loops, peripherals including counter timers, real-time timers and power-on reset generators, external interfaces, such as USB, Firewire, Ethernet, SPI, and the like, analog interfaces including ADCs and DACs, voltage regulators and power management circuits on the electronic chip, in any combination. Some of these components may form part of the electronic circuitry realizing the at least one processing core implementing the central processing unit while others may be separate and dedicated components of the data tracking communications chip that are realized by one or more electronic circuits implementing the desired functionality. The game and/or simulation engine and position engine may be directly coupled to the central processing unit and/or may utilize a buffer or memory to exchange data between the central processing unit and the game and/or simulation engine or position engine. The central processing unit may also include further interfaces to directly couple to the hardwired game and/or simulation engine and position engine. By coupling the game and/or simulation engine and position engine to the central processing unit using dedicated data links and/or buffers, the data exchange speed and throughput can be greatly improved and optimized since data exchange can be carried out via short data links and no complex data exchange protocols need to be implemented.

In a further embodiment, a plurality of the processing cores implement a plurality of central processing units, each central processing unit being configured to execute instructions of a different instruction set architecture. Hence, the electronic chip may execute software on the individual central processing units, which may be compiled for different systems, including but not limited to Intel's x86 architecture as commonly used in personal computer systems, and systems based on the ARM instruction set, which is typically used in mobile phones and tablets. Hence, the electronic chip may be used in a heterogeneous environment providing a unified access to a well-defined game and/or simulation engine interface for a broad range of software, without requiring an adaptation of the software to a particular instruction set architecture.

In another alternative embodiment, the game and/or simulation engine and position engine are configured to communicate data via the hardware interface with an external CPU or GPU. The game and/or simulation engine and position engine may receive data from an external entity, such as a CPU or GPU, via the at least one hardware interface. The game and/or simulation engine and position engine may send processed data via the hardware interface to the external entity or another external entity. In some embodiments, the hardware interface may be a bus interface or an external interface. The processed data may be supplied to the external CPU or GPU for further processing and/or rendering on a target display.

In yet another alternative embodiment, at least one of the processing cores implements a graphics processing unit (GPU) (in hardware). Hence, the GPU can be regarded as a hardwired graphics processing unit on the electronic chip.

The at least one hardware interface may include a media interface, such as HDMI and the like, which may provide data rendered by the on-chip graphics processing unit to a display or screen. However, it is to be understood that the GPU may also interface, via, the hardware interface, with a bus or other interconnect of a host system to provide the rendered data for display.

In yet another embodiment, the game and/or simulation engine and position engine are configured to generate data for the GPU. The game and/or simulation engine and position engine may pre-process input data that may be suitable for processing on the specialized hardware of the GPU, which may include SIMD processing or vector processing as is known in the art. The preprocessed data may be provided to the on-chip GPU, which may further process the data and/or generate a final rendering of the graphics scene based on the preprocessed data. The GPU may also provide the results to the game and/or simulation engine and position engine for further processing. Hence, the game and/or simulation engine and position engine may prepare data or data sets and offload specific tasks to the GPU in order to exploit the GPU functionality or the specialized hardware of the GPU.

In some embodiments, the game and/or simulation engine and position engine may store the preprocessed data in the memory and may issue a command to the on-chip GPU to read and further process the data. The on-chip graphics processing unit may use the memory or a different communication channel to communicate the results to the hardwired game and/or simulation engine and/or position engine. A register or a register set may be used to control properties of the memory, to indicate characteristics of the stored data and/or to control operation of the on-chip GPU.

According to an embodiment, at least one of the one or more processing cores further implements an inertia measuring unit (IMU) configured to provide further 6 DOF position and orientation data to the position engine for further refining the positioning data. The IMU is configured to measure and report the velocity, acceleration, angular momentum, speed of translation, speed of rotation, and other data of the client device by using a combination of accelerometers and gyroscopes. The IMU may be a MEMS IMU. Accelerometers within the IMU may be configured to measure the acceleration of the device, including the acceleration due to the Earth's gravitational field. In one embodiment, accelerometers within the IMU may include a tri-axial accelerometer that is capable of measuring acceleration in three orthogonal directions. In other embodiments one, two, three, or more separate accelerometers may be included within the IMU.

According to an embodiment, the one or more game and/or simulation engine and the position engine are coupled into a single engine processing core, herein referred to as an engine core. The engine core may provide functionality in hardware of a game and/or simulation engine and of a position engine on a single, common hardware processing core, which may reduce processing times by enabling fast communication via short data links.

According to an embodiment, the game and/or simulation engine is subdivided into dedicated hardware components comprising a 3D structures-and-physics engine and a simulation processor implemented on the single engine processing core. The 3D structures-and-physics processor may be configured to perform 3D data algorithms in order to determine a faithful approximation of a given surface's geometry and processing of images into suitable data structures (e.g., octrees, quadtrees, BSP trees, sparse voxel octrees, 3D arrays, and k-d trees). The 3D structures-and-physics processor may further be configured to perform algorithms that provide an approximate simulation of certain physical systems, such as rigid body dynamics (including collision detection and crowd steering), soft body dynamics, mass particle dynamics, and fluid dynamics.

According to an embodiment, the game and/or simulation engine is further subdivided into a dedicated rendering engine implemented on the single engine processing core, the rendering engine being configured to perform rendering algorithms on data in order to synthesize images to generate photorealistic 3D models.

In an alternative embodiment, at least one of the one or more processing cores of the data tracking communications chip implements a position and communications engine configured to receive antenna signals from cellular positioning systems, and thereby compute the position of the client device through methods such as ToA, AoA and AoD. The position and communications engine can further receive orientational data from the gyroscope to further refine the already-computed positioning data. The position and communications engine may receive further IMU data to refine the positioning data and compute an accurate 6 DOF client device position, driving the operations of 3D applications executed by the at least one game and/or simulation engine. The position and communications processing core may include dedicated hardware comprising one or more dedicated receivers, transmitters, or transceivers to receive and send communication signals from cellular telecommunication network antennas, short-range tracking systems, or combinations thereof. In further embodiments, the 6 DOF position and orientation can be further augmented by a 3D structure of real world objects stored in a virtual world system, by simulation data from the game and/or simulation engine, or combinations thereof.

In an illustrative scenario, a position and communications engine is configured to obtain first positioning data from a cellular positioning system via a hardware interface and compute an initial position and orientation of a client device. The position and communications engine is configured to augment the initial position and orientation based on second positioning data received from one or more short range communication systems and orientational data received from one or more gyroscopes, and by performing virtual world system computations, thereby obtaining a refined 6 degrees of freedom (6 DOF) position and orientation, which can be used in operations of 3D applications executed by one or more game engines and/or simulation engines on the chip.

In another embodiment, the position and communications engine implements, in hardware, a distributed ledger-based communications pipeline between users of a host device including one or more data tracking communications chips according to embodiments of the current disclosure. The distributed ledger-based communications pipeline may enable direct communication between users through a decentralized network by allowing storage of information in a secure and accurate manner using cryptography, employing cryptographic "keys" and cryptographic signatures. Once the information is stored, the data becomes an immutable database and is governed by rules of the network.

In yet other embodiments, the data tracking communications chip comprises both the position engine and the communications unit as separate components, such as separate processing cores. In other embodiments, the position engine and communications unit may be configured in a single EPU. In this embodiment, other components (game and/or simulation engine, inertia sensors, memory, optional CPU and/or GPU, etc. and the operations of each may be as described in embodiments of the current disclosure.

In some embodiments, the computed 6 DOF positioning data can be shared through either of the at least one hardware interface, position engine through the GNSS network, or through the communications engine or the position and communications engine using the cellular communications network or short range communication systems.

According to an embodiment, the data tracking communications chip is implemented as a system on a chip (SoC).

According to an embodiment, a chip assembly comprises at least one chip, wherein the at least one chip comprises one or more processing cores; and at least one hardware interface coupled to at least one of the one or more processing cores, wherein at least one of the one or more processing cores implements a game and/or simulation engine in hardware by dedicated electronic circuitry, wherein at least one of the one or more processing cores implements a position engine in hardware by dedicated electronic circuitry, and wherein at least one of the one or more processing cores implements a gyroscope. In a further embodiment, at least one of the one or more processing cores implements an IMU. In a further embodiment, at least one of the one or more processing cores implements a position and communications processing core. In a further embodiment, at least one of the one or more processing cores implements a communications engine. In a further embodiment, the at least one chip further comprises a memory. In a further embodiment, at least one of the one or more processing cores implements a CPU and/or GPU or connect to one or more external CPUs and/or GPUs. In a further embodiment, the position engine (or alternative position and communications engine or communications engine) and game and/or simulation engine, are implemented on single engine core. In a further embodiment, the game and/or simulation engine is subdivided into dedicated hardware components comprising a 3D structures-and-physics engine and a simulation processor implemented on the single engine processing core. In a further embodiment, the game and/or simulation engine is further subdivided into a dedicated rendering engine implemented on the single engine processing core.

According to an embodiment, a computing device comprises at least one data tracking communications chip, wherein the at least one chip comprises one or more processing cores and at least one hardware interface coupled to at least one of the one or more processing cores, wherein at least one of the one or more processing cores implements a game and/or simulation engine in hardware by dedicated electronic circuitry, and wherein at least one of the one or more processing cores implements a position engine in hardware by dedicated electronic circuitry; an input/output module configured to input data to the at least one chip and to display data based on data provided by the at least one chip; and one or more sensing mechanisms configured to capture sensor data and to provide the data to the one or more processing cores. In a further embodiment, at least one of the one or more processing cores implements an IMU, In a further embodiment, at least one of the one or more processing cores implements a position and communications engine. In a further embodiment, at least one of the one or more processing cores implements a communications engine. In an alternative embodiment, the computing device comprises a separate communications unit. In a further embodiment, the at least one chip of the computing device further comprises a memory. In a further embodiment, at least one of the one or more processing cores implements a CPU and/or GPU or connect to one or more external CPUs and/or GPUs. In a further embodiment, at least one of the one or more processing cores implements a CPU and/or GPU or connect to one or more external CPUs and/or GPUs. In a further embodiment, the position engine (or alternative position and communications engine or communications engine) and game and/or simulation engine, are implemented on a single engine core. In a further embodiment, the game and/or simulation engine is subdivided into dedicated hardware components comprising a 3D structures-and-physics engine and a simulation processor implemented on the single engine processing core. In a further embodiment, the game and/or simulation engine is further subdivided into a dedicated rendering engine implemented on the single engine processing core.

According to an embodiment, a system enabling data tracking communications comprises at least one client device implementing one or more data tracking communications chip comprising an internal tracking and communications system; an external positioning system communicatively connected to the data tracking communications chip via one or more hardware interfaces; and a server storing and computing a virtual world system hosting at least one virtual replica, wherein the data tracking communications chip computes and refines the client device 6 DOF pose by using position and orientation tracking data from the external and internal tracking and communications systems, thereby driving the operations of 3D applications hosted in the server. In further embodiments, the computed 6 DOF positioning data can be shared through either of the at least one hardware interface, position engine through the GLASS network, or through the communications engine or the position and communications engine using the cellular communications network or short range communication systems.

In some embodiments, the virtual world system comprises a context-rich virtual version of the real-world, including real-world coordinates, such as position, orientation, scale and dimension of real-world objects, the physical properties, and the 3D structure of each of the real objects in the form of real-time 3D virtual replicas. The server may further store a content or virtual replica editor configured to enable users to create and edit the real-time 3D virtual replicas of the real object. However, the virtual world system may further include computer-generated virtual objects that may not exist in the real world, such as objects that are purely virtual. The virtual replicas of the real world created through the content editor may be accessed by devices including a data tracking communications chip of the current disclosure through the network, and thus may provide the chip with 3D structure data of objects in the real world for positioning data augmentation techniques herein described.

According to an embodiment, the replica editor stored in the server comprises software and hardware configured to enable users to model and edit the real-time 3D virtual replicas of the real objects. The replica editor may be, for example, a computer-aided drawing (CAD) or computer-aided engineering (CAE) software that may store data and instructions necessary to input and edit virtual replicas. The replica editor may enable the input of explicit data and instructions that relate to each digital replica, which in some embodiments includes data and instructions that describe the shape, location, position and orientation, physical properties, 3D structure, and the expected functioning and impact of each real-time 3D virtual replica and the virtual world system as a whole. Generally, the explicit data may include data that may not be obtained by the sensing mechanisms but which instead may need to be input digitally through the replica editor, such as building materials, wall thicknesses, electric installations and circuitry, water pipes, fire extinguishers, emergency exits, window locations, machine performance parameters, machine sensor and valve locations, etc. "Instructions," as used herein, refers to code (e.g., binary code) that is understood by a processor. Instructions may represent, on the virtual replica, the behavior of the real world element.

Modeling techniques for converting real objects into real-time 3D virtual replicas with explicit data and instructions and make them available in the virtual world system may be based on readily-available CAD models of the real objects. For example, machine owners may provide to an administrator of the virtual world system, or may input themselves, the already-existing digital CAD models of their machines. Similarly, building owners may provide building information models (BIM) with building details to be stored in the virtual world system in the server, which may include information that may not be visible or easily obtainable via sensing mechanisms. In these embodiments, the owners of these real objects may be responsible for adding the respective real-time 3D virtual replicas into the virtual world system, which may be achieved, for example, through incentive systems or by legal requirements. In some embodiments, the administrators of the virtual world system, government officials, or other relevant authorities, may collaborate with owners of real objects for inputting the real-time 3D virtual replicas into the virtual world system, thereby realizing a faster and more thorough creation of the virtual world system in the server. In other embodiments, radar-imaging, such as synthetic-aperture radars, real-aperture radars, AVTIS radars, Light Detection and Ranging (LIDAR), inverse aperture radars, monopulse radars, and other types of imaging techniques may be used to map and model real objects before integrating them into the virtual world system. Independent of the modeling techniques used for creating the virtual replicas, the information of each virtual replica should provide sufficient details about each corresponding real world element so that a highly accurate real-time 3D virtual replica of each real world object is available. The real-time 3D virtual replicas, whenever possible, are then enriched and synchronized through the multi-source data (e.g., multi-source sensor data). Thus, each or most real-time 3D virtual replica includes explicit data and instructions input via the replica editor and multi-source data input via the plurality of sensing mechanisms.

According to an embodiment, a method enabling data tracking communications implemented on a system of the current disclosure may begin by providing, on a client device, at least one data tracking communications chip comprising an internal positioning system; providing an external positioning system; requesting, by the data tracking communications chip, wireless radio signals from one or more systems of the external positioning system; computing, by the data tracking communications chip, the initial position of the client device; obtaining further positioning data from one or more systems of the internal positioning system; computing a refined user device 6 DOF position and orientation; and updating one or more 3D applications, by the data tracking communications chip, based on computed 6 DOF position and orientation. In some embodiments, the method further comprises sharing, by the data tracking communications chip, the computed 6 DOF position and orientation, which may be done through either of the at least one hardware interface, position engine through the GNSS network, or through the communications engine or the position and communications engine using the cellular communications network or short range communication systems.

In an embodiment, a method includes requesting, by a data tracking communications chip on a client device, wireless radio signals from one or more external positioning systems, wherein the data tracking communications chip comprises an internal positioning system; computing, by the data tracking communications chip, an initial position of the client device using the internal positioning system, wherein the initial position of the client device is computed based at least in part on data obtained from the wireless radio signals; refining the initial position of the client device by computing a 6 DOF position and orientation of the client device; and updating, by the data tracking communications chip, one or more 3D applications based on the computed 6 DOF position and orientation of the client device.

The above summary does not include an exhaustive list of all aspects of the present disclosure. It is contemplated that the disclosure includes all systems and methods that can be practiced from all suitable combinations of the various aspects summarized above, as well as those disclosed in the Detailed Description below, and particularly pointed out in the claims filed with the application. Such combinations have particular advantages not specifically recited in the above summary. Other features and advantages will be apparent from the accompanying drawings and from the detailed description that follows below.

BRIEF DESCRIPTION OF THE DRAWINGS

Specific features, aspects and advantages of the present disclosure will be better understood with regard to the following description and accompanying drawings, where.

DETAILED DESCRIPTION

In the following description, reference is made to drawings which show by way of illustration various embodiments. Also, various embodiments will be described below by referring to several examples. It is to be understood that the embodiments may include changes in design and structure without departing from the scope of the claimed subject matter.

The current disclosure describes embodiments of an electronic chip, chip assembly, device, system, and method enabling data tracking communications for use in game and/or simulation applications. The electronic chip or chip assembly of the current disclosure comprise a plurality of processing cores implementing function-specific hardwired engines and other components that, when their functions are fused through hardware-based algorithms, can enable an accurate device positioning that can be used in a plurality of applications. However, in each of the embodiments described below, at least one of processing cores can also implement one or more on-chip CPUs and/or a GPUs or can be connected to one or more external CPUs and/or GPUs through at least one hardware interface in order to provide processing support to the one or more function-specific cores, or to other components of the electronic chip or chip assembly.

FIGS. 1A-1H illustrate schematic views of a data tracking communications chip.

Figure 1A:
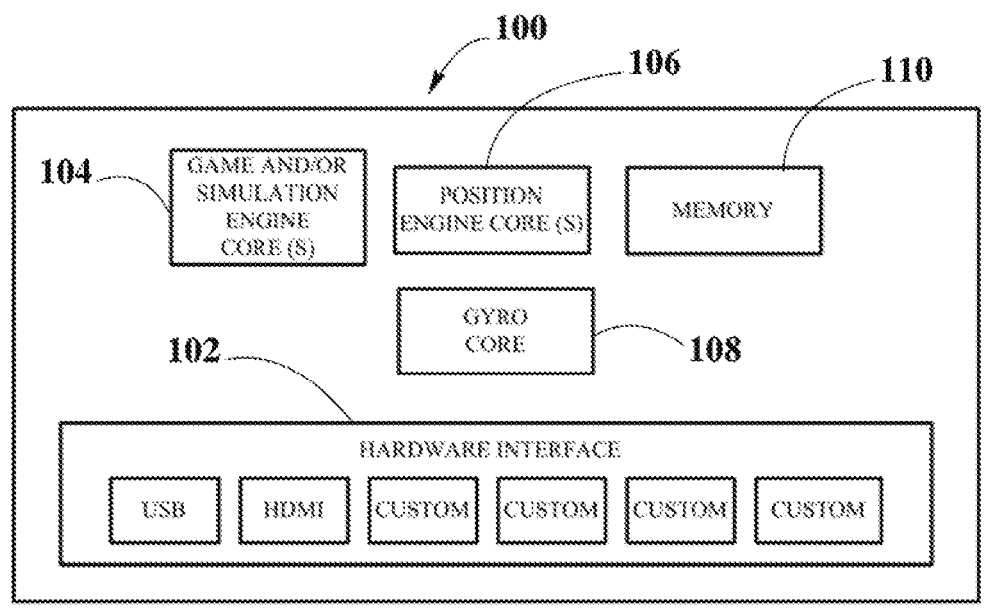
FIGS. 1A-1H illustrate a schematic view of a data tracking communications chip including at least one hardwired game and/or simulation engine, one or more position engines, and one or more gyroscopes, according to one embodiment.

In FIG. 1A, the data tracking communications chip 100 comprises a plurality of processing cores; and at least one hardware interface 102 coupled to at least one of the plurality of processing cores, wherein at least one of the plurality of processing cores implements at least one game and/or simulation engine core, which is referred to herein more simply as game and/or simulation engine 104, wherein at least one of the plurality of processing cores implements at least one position engine core, which is referred to herein more simply as position engine 106, and wherein at least one of the plurality of processing cores implements at least one gyroscope core, which is also referred to herein more simply as gyroscope 108.

The position engine 106 implemented in the at least one processing core is configured to gradually obtain and fuse position and orientation data from different sources and obtained through a plurality of methods in order to compute a highly accurate 6 DOF position and orientation of a client device implementing a data tracking communications chip 100. In some embodiments, the position engine 106 may first obtain data from one or more systems within an external positioning system that can provide data to the position engine via the one or more hardware interfaces 102 or directly to the position engine 106, as required by each case. Each position computation by the position engine 106 provides a further layer of accuracy to the actual position of a client device implementing the data tracking communications chip 100. In a further embodiment, the position engine 106 implemented in the at least one processing core further obtains position and orientation data from an internal positioning system, which can provide a further layer of accuracy to the position and orientation of the client device implementing the data tracking communications chip 100.

The positioning data augmentation at each subsequent positioning layer after an initial position and orientation have been computed, may be realized through a request by the position engine to the one or more further systems, such as systems from the external positioning system or internal positioning system. The external positioning systems refer to systems that can send data directly to the position engine or via the one or more hardware interfaces 102, and which are not integrated, in the data tracking communications chip. The external positioning system may comprise global navigation satellite systems (GNSS), cellular networks, and short range communication systems. The internal positioning systems refer to systems that are integrated in the data tracking communications chip or which can be computed through software utilizing data stored in the data tracking communications chip 100 or to which the data tracking communications chip 100 may have access (e.g., stored and computed or partially computed on a server).

The level of accuracy required by the data tracking communications chip 100, and thus the number of position and orientation refinement iterations performed by the position engine 106, may depend on the type of application that may require the positioning services. For example, applications related to the medical Feld or autonomous driving may, where the human life might be at stake, may require a higher level of accuracy than applications related to video games or entertainment. However, in all embodiments provided, the position and orientation computed by the position engine 106 may be provided at a continuous rate. Hence, in some embodiments of the current disclosure, the different positioning systems used to provide the position engine to compute a highly accurate 6 DOF position and orientation of client devices are configured to implement different, complementary positioning update rates, that may serve to compensate for periods in which normally there would be a lack of positioning data, improving the percentage of availability, integrity, continuity and accuracy of the positioning, depending on the situation and priorities of the application.

In one embodiment, the at least one position engine 106 implemented in one or more of the processing cores obtains positioning data from a global navigation satellite systems (GNSS) and computes the respective position of a client device comprising the data tracking communications chip 100. The positioning data obtained via GNSS can refer to position, velocity and time (PVT) data. The positioning data obtained by the position engine 106 from the GNSS can be used by the data tracking communications chip 100 to compute an initial position of the client device, which can be further refined through other methods of the current disclosure.

As known in the art, positioning only through GNSS can sometimes be weak or insufficiently accurate in complicated environments, such as urban areas and inside buildings. Therefore, the data tracking communications chip 100 further allows integrating positioning from other systems in order to augment GNSS. The positioning data from GNSS can thus be further augmented at least by positioning data sent wirelessly by a cellular positioning system (i.e., a cellular network) connected to the chip via the at least one hardware interface 102.

In a further embodiment, for positioning in short-range or indoor situations, the positioning data can be further augmented by positioning data from short range communication systems, such as Wireless Local Area Networks (WLAN), such as WLAN marketed under the Wi-Fi brand name, or through Personal Area Networks (PANs), such as PANs marketed under the Bluetooth, ZigBee and ultrawideband (UWB) standards.

In other embodiments, the refined positioning data can be further augmented by orientational data obtained by the at least one position engine 106 via the one or more gyroscopes 108, enabling the position engine 106 to compute a 6 DOF position and orientation of the respective client device.

In further embodiments, the 6 DOF position and orientation obtained through one or more of the methods above can be further augmented by virtual world system computations comprising 3D structure computations of real world objects stored in a virtual world system stored and computed on a server; simulation data from the game and/or simulation engine 104; or combinations thereof. The virtual world system comprises the digital version of the real-world, including real-world coordinates, such as position, orientation, scale and dimension of real-world objects, the physical properties, and the 3D structure of each of the real objects in the form of real-time 3D virtual replicas. 3D applications that are processed by the game and/or simulation engine 104 are thus positioned within the virtual world system relative to the virtual replicas of the real world.

The server 610 may further store a content or virtual replica editor (not shown) configured to enable users to create and edit the real-time 3D virtual replicas of the real object. However, the virtual world system 612 may further include computer-generated virtual objects that may not exist in the real world, such as objects that are purely virtual. The virtual replicas of the real world created through the content editor may be accessed by devices including a data tracking communications chip 604 of the current disclosure through the network 616, and thus may provide the chip with 3D structure data 628 of objects in the real world for positioning data augmentation techniques herein described.

Thus, using the positioning from the GNSS and further refining the data with one or more of a plurality of other methods via the one or more processing cores of the data tracking communications chip 100, the hardwired position engine 106 may compute a 6 DOF position and orientation of a client device implementing the data tracking communications chip 100. The 6 DOF position and orientation are thereafter used by the game and/or simulation engine 104 in order to drive the operations of 3D applications thereon executed, such as for accurately rendering 3D content in the field of view of a user. In a further embodiment, the 6 DOF position and orientation can also be shared by one or more of the position engine 106 via the GNSS (provided that the satellite system of the GNSS enables two-way communications, e.g., through BDS), or through the mobile network via the hardware interface 102.

According to an embodiment, the data tracking communications chip 100 further comprises a memory 110 configured to store data and to provide the data to one or more processing cores. For example, the position engine 106 may store position and orientation data in the memory 110 for the game and/or simulation engine 104 to retrieve the data from the memory 110 and thereafter use the data during 3D application task processing. A register or a register set may be used to control properties of the memory 110, to indicate characteristics of the stored data and/or to control operation of the one or more processing cores. In other embodiments, the data may be stored in an external main memory of the host system, which may be accessible via one or more ports of an on-chip memory controller. The memory 110 may comprise temporary storage in addition to persistent storage.

The GNSS systems includes a network of satellites used for global positioning of devices, Employing signals from a sufficient number of satellites and techniques such as triangulation and trilateration, GNSS can calculate the position, velocity, altitude, and time of devices. The GNSS may comprise one or more of several satellite systems, such as GPS, BDS, Glonass, QZSS, Galileo, and IRNSS. In an embodiment, the external positioning system is augmented by assisted GNSS (AGNSS) through the architecture of existing cellular communications network, wherein the existing architecture comprises mmW antennas from, for example, a 5G network, via methods such as time of arrival (ToA), angle-of-arrival (AoA) and angle-of-departure (AoD). In other embodiments, the external tracking system is further supported by a 4G cellular communications network. Augmentations to the GNSS via Wi-Fi can, in some embodiments, comprise the Wi-Fi system providing data at 60 GHz. In alternative embodiments, the GNSS is augmented via other techniques known in the art, such as via differential GPS (DIPS), satellite-based augmentation systems (SBASs), real-time kinematic (RTK) systems.

Hence, the current provides on-chip hardware implementations of GNSS that, when fused with positioning data cellular positioning systems (such as but not limited to 5G networks), short-range communication systems, inertia navigation systems (INS) (e.g., the gyroscope 108), and alternatively software computations and simulations, can result in highly accurate 6 DOF position and orientation computations that can be used by the on-chip game and/or simulation engine 104 to compute high-quality and highly-accurate location-based media content to users for a plurality of 3D applications.

The position engine 106 may utilize algorithms such as the Extended Kalman Filter (EKF) to combine the absolute positioning of the external positioning system and the relative positioning of the gyroscope 108 and thus obtain very low-error, highly-accurate 6 DOF position and orientation of the devices implementing the one or more data tracking communications chip 100. A Kalman Filter, also known as linear quadratic estimation (LQE), is an algorithm that uses a series of measurements observed over time, comprising statistical noise and other inaccuracies, and produces estimates of unknown variables that tend to be more accurate than those based on a single measurement alone, by estimating a joint probability distribution over the variables for each timeframe. For example, the position engine 106 may use tightly coupled GNSS/INS integration algorithms based on merging the raw GNSS data with raw gyroscope (or other INS system) data. The raw GNSS observations such as pseudo-range and carrier phase can be used for such integration, Thus, the position engine 106 may be considered as an on-chip, hardwired fusion sensor core configured to implement position and orientation hardwired algorithms from a plurality of data sources for fusing the positioning data and obtaining a highly accurate 6 DOF position and orientation for us by the hardwired game and/or simulation engine 104 during operation of 3D applications or sharing with other systems. The at least one hardware interface 102 enables a direct interaction with the one or more processing cores. The hardware interface 102 may be realized as a part of the at least one integrated circuit of the data tracking communications chip 100. However, the hardware interface 102 may also be realized as one or more further integrated circuits providing the functionality of interfacing the processing cores. For example, the hardware interface 102 may enable an external cellular positioning system to provide communications to the chip, and also to provide cellular tracking data as input data to refine the positioning of the client device comprising the one or more data tracking communications chips 100.

The at least one gyroscope 108 may refer to a microelectromechanical systems (MEMS) gyroscope 108, which may be suitable to be manufactured as a processing core on integrated circuits such as on the data tracking communications chip 100 according to embodiments of the current disclosure. MEMS are microscopic devices made up of components between 1 and 100 micrometers in size (i.e., 0.001 to 0.1 mm), and MEMS devices generally range in size from 20 micrometres to a millimetre (i.e., 0.02 to 1.0 mm). A MEMS gyroscope uses the principles of vibrating structure gyroscopes, which use a vibrating structure to determine the rate of rotation. The underlying physical principle is that a vibrating object tends to continue vibrating in the same plane even if its support rotates. The Coriolis effect causes the object to exert a force on its support, and by measuring this force the rate of rotation can be determined. MEMS gyroscopes can use lithographically constructed versions of one or more mechanisms such as tuning forks, vibrating wheels, or resonant solids of various designs known in the art.

In some embodiments, the hardwired game and/or simulation engine 104 is configured to perform one or more tasks on input data thereby generating data sets. In an embodiment, the hardwired game and/or simulation engine 104 may be implemented on a processing core that implements hardwired algorithms and code functions, which may be applied to data. This may enable faster graphics or simulation results in 2D, 3D or 4D (3D+time) even for stereo displays. The input data may be input by a user through suitable programming interfaces, captured by one or more external sensing mechanisms communicatively connected to the data tracking communications chip 100 via the at least one hardware interface 102, or any combination thereof. The input data may include one or more of an image data, 3D geometries, video data, audio data, textual data, haptic data, time data, position and orientation data, or any combination thereof. In some embodiments, the hardwired game and/or simulation engine 104 receives the 6 DOF position and orientation data from the position engine 106, and proceeds to use this data during the processing of the 3D applications. For example, media streams from AR or VR video games requiring a highly accurate position and orientation of a user can be provided so that each one of the objects in the field of view of the user are accurately rendered with respect to the position and orientation of the user, independent of being indoors or outdoors.

In some embodiments, the one or more tasks performed by the hardwired game and/or simulation engine 104 on the input data may be defined by and reflect the functionality of the game and/or simulation engine 104. The electronic chip may expose an interface for controlling the game and/or simulation engine 104 according to its functionality. In some embodiments, the one or more tasks may be initiated via the interface of the on-chip game and/or simulation engine 104. The one or more tasks may be performed in real-time during the programming of a video game or other 3D application, but may also be performed during application run-time (i.e., the actual real-time execution of the application by a user), whereby the game and/or simulation engine 104 may process data in real time. In yet another embodiment, the one or more tasks include one or more of determining how objects cast shadows over other objects, determining how objects are reflected in other objects, or determining how the light falling on one object illuminates other surrounding objects. In addition or as an alternative, the game and/or simulation engine 104 may perform other and further tasks, including tasks directed at simulation and/or rendering of graphics scenes, such as a simulation of individual objects of the graphics scene, a determination of characteristics of objects of the graphics scene, rendering of one or more of the objects of the graphics scene, and the like. The game and/or simulation engine 104 may further obtain a client device position and orientation data from the position engine 106 in order to simulate and further predict the position and orientation of the client device. By way of example, the simulation engine may be used in a chip implemented in a self-driving vehicle or drone in order to predict their immediate path. The prediction may be performed by obtaining the current position, orientation, speed and acceleration of the self-driving vehicle or drone and using these data to interpolate their immediate path.

In addition or as an alternative, the game and/or simulation engine 104 may perform one or more of viewport culling and coverage (z-) buffer culling to determine visibility of objects, voxelization of a scene as a preparation step for global illumination calculations, sparse voxel-based cone tracing for global illumination, muscle fiber mechanics and musculoskeletal skinning, finite element methods for biomechanical muscle modelling, fluid dynamics using SPH (smoothed-particle hydrodynamics) for realistic effects involving water volumes, volcanic lava volumes, and astrophysical effects, which may be related to surfaces of stars, real-time Eulerian water simulation, or realistic vegetation dynamics, and the like, in any combination.

FIGS. 1B-1H may include similar elements as those of FIG. 1A, and may therefore contain the same or similar reference numbers.

Figure 1B:
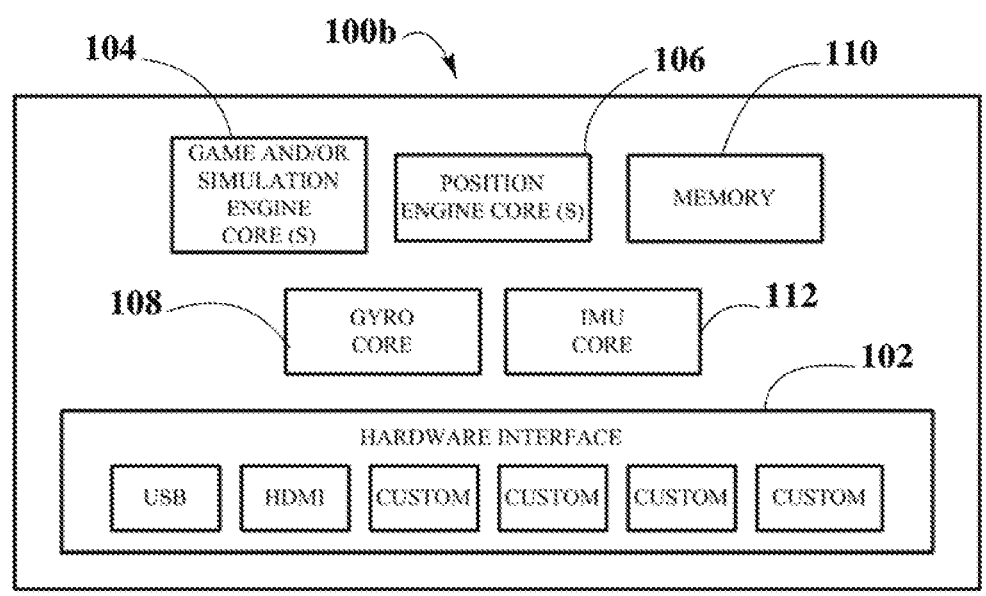

FIG. 1B depicts an embodiment of a data tracking communications chip 100b where at least one of the one or more processing cores further implements an inertia measuring unit (IMU) 112.

The IMU 112 is configured to provide 6 DOF position and orientation data to the position engine 106 for further refining the positioning data. The IMU 112 is configured to measure and report the velocity, acceleration, angular momentum, speed of translation, speed of rotation, and other data of the client device by using a combination of accelerometers and gyroscopes. The IMU 112 may be a MEMS IMU 112. Accelerometers within the IMU 112 may be configured to measure the acceleration of the device comprising the data tracking communications chip 100b, including the acceleration due to the Earth's gravitational field. In one embodiment, accelerometers within the IMU 112 may include a tri-axial accelerometer that is capable of measuring acceleration in three orthogonal directions. In other embodiments one, two, three, or more separate accelerometers may be included within the on-chip IMU 112. Additional functions of each of the other components of the data tracking communications chip 100b (e.g., game and/or simulation engine 104, position engine 106, gyroscope 108, memory 110, and hardware interface 102) may be similar to the functions in the description with reference to FIG. 1A.

Figure 1C:
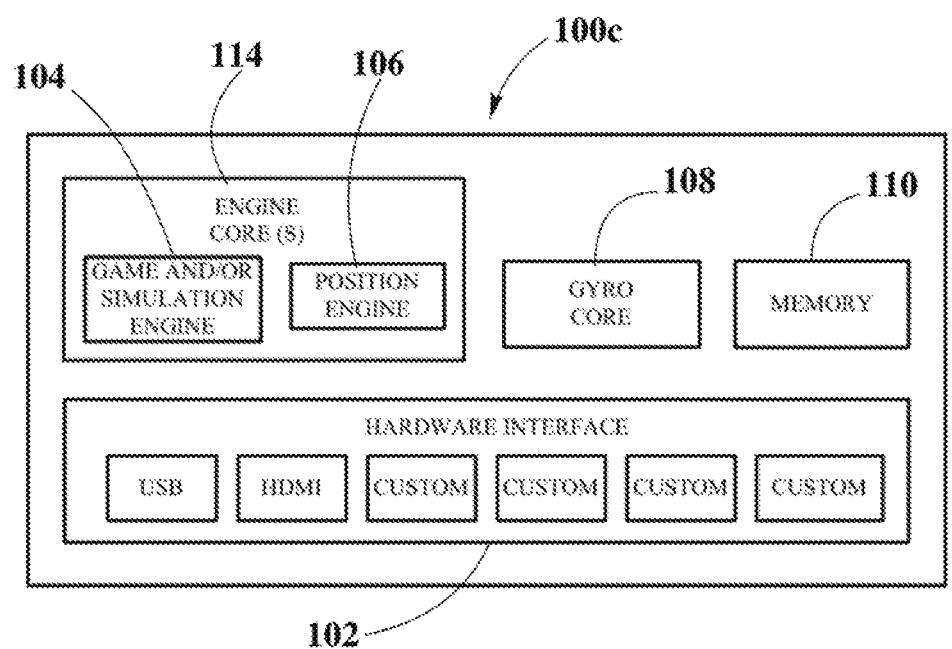

FIG. 1C depicts an embodiment where a data tracking communications chip 100c implements a game and/or simulation engine 104 with a dedicated position engine 106, whereby implementations are performed by dedicated electronic circuitry on at least one common processing core, or engine core 114. Providing the game and/or simulation engine 104 and position engine 106 on a single, common hardware processing core may reduce processing times by enabling fast communication via short data links. Additionally, implementing a position engine 106 dedicated to a single game and/or simulation engine 104 may improve efficiency because the position engine 106 may only need to process data from the game and/or simulation engine 104 to which the position engine 106 is dedicated. Additional functions of each of the game and/or simulation engine 104 and position engine 106 of the data tracking communications chip 100c and the remaining components (gyroscope 108, memory 110, and hardware interface 102) may be similar to the functions in the description with reference to FIG. 1A.

Figure 1D:
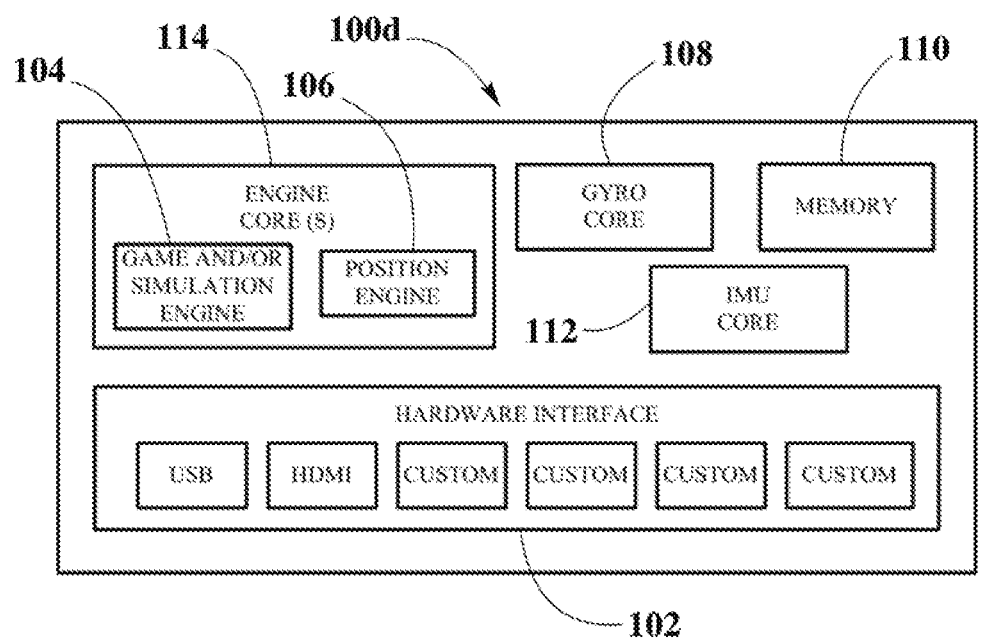

FIG. 1D depicts an embodiment where a data tracking communications chip 100d displays the same features as those of the data tracking communications chip 100c of FIG.

1C, but wherein at least one of the one or more processing cores further implements an MU 112 with the same functions as those described with reference the IMU 112 of FIG. 1B, providing further 6 DOF position and orientation data to the position engine 106 for a more accurate device positioning.

Figure 1E:
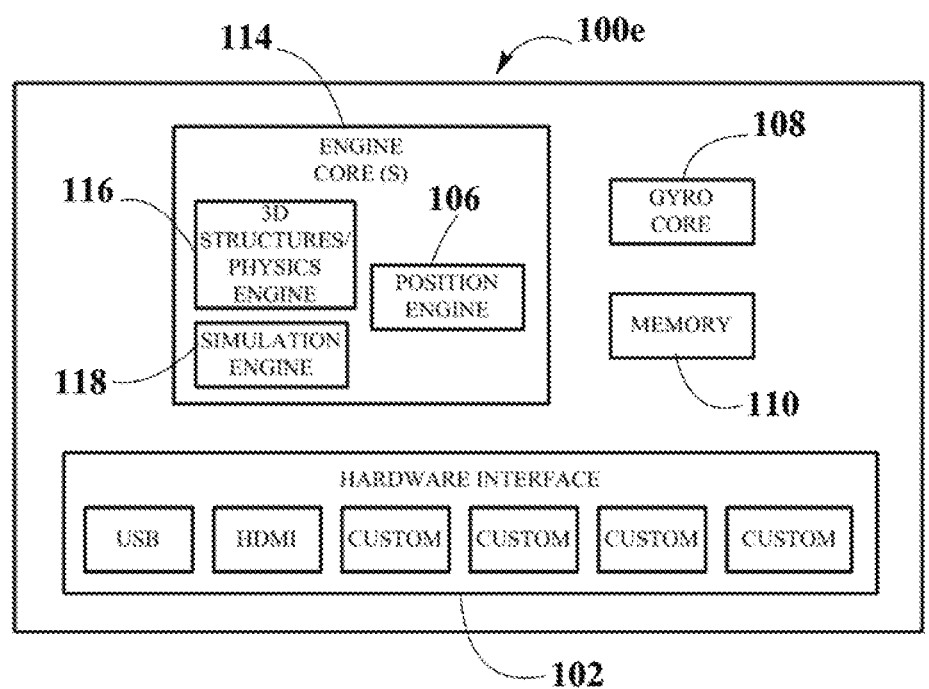

FIG. 1E depicts an embodiment where a data tracking communications chip 100e where the game and/or simulation engine 104 described with reference to FIGS. 1A-D is further subdivided into dedicated hardware components comprising a 3D structures-and-physics engine 116 and a simulation engine 118 implemented on a single engine core 114. The 3D structures-and-physics engine 116 may be configured to perform hardwired 3D data algorithms in order to determine a faithful approximation of a given surface's geometry and processing of images into suitable 3D data structures (e.g., octrees, quadtrees, BSP trees, sparse voxel octrees, 3D arrays, and k-d trees). The 3D structures-and-physics engine 116 may further be configured to perform algorithms that provide an approximate simulation of certain physical systems, such as rigid body dynamics (including collision detection and crowd steering), soft body dynamics, mass particle dynamics, and fluid dynamics, amongst others.

The simulation engine 118 comprises dedicated hardware circuitry configured to implement algorithms for simulating the behavior, functions and abstract or physical properties of real-world objects into virtual replicas positioned in the virtual world system, and to predict such characteristics and behaviors. The simulation engine may obtain a plurality of data related to each real-world object through various methods, such as by inputting data sets through a virtual replica editor that may be part of a computer aided drawing (CAD) software or other similar system, by inputting data (e.g., sensor data) of each of the real-world objects that can serve to enrich and/or complement the input data, or by using combinations thereof. For example, the real-world object data may be obtained by inputting a building information model (BIM), which provides a plurality of features related to the appearance and operations of a building. In another example, the real-world object data may be obtained by inputting the virtual model of a car providing a plurality of features related to the appearance and operations of the car. In another example, radar-imaging, such as synthetic-aperture radars, real-aperture radars, Light Detection and Ranging (LIDAR), inverse aperture radars, monopulse radars, and other types of imaging techniques may be used to map and model real world entities before integrating them into the virtual world.

The simulation engine 118 may further obtain a client device position and orientation data from the position engine 106 in order to simulate or to further predict the position and orientation of the client device comprising the data tracking communications chip 100e.

By implementing dedicated circuitry for each of the individual 3D structures-and-physics engine 116 and simulation engine 118 implemented on the single engine core 114, functionality of each of these components is enhanced because of being assigned dedicated hardware for their specific function. This may result in an engine core 114 providing enhanced functionalities of a game and/or simulation engine 104 with enhanced positioning capabilities for use in a plurality of applications.

Figure 1F:
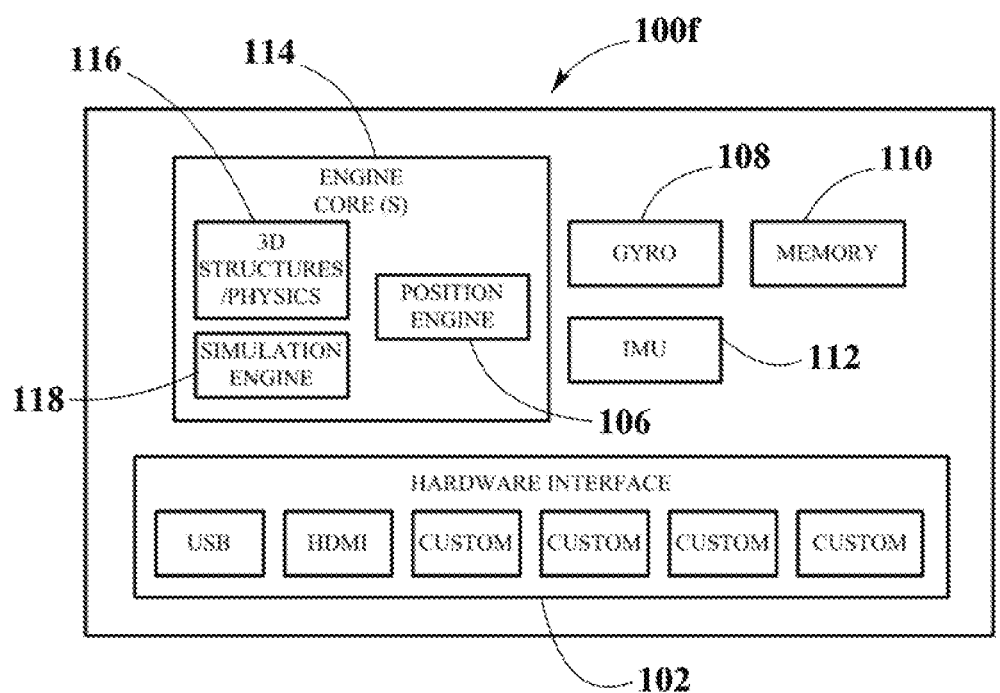

FIG. 1F depicts another embodiment of a data tracking communications chip 100f similar to that of the data tracking communications chip 100e of FIG. 1E, but where at least one of the one or more processing cores implements an IMU 112 with the same functions as those described with reference to the IMU 112 of FIG. 1B, providing further 6 DOF position data to the position engine 106 for a more accurate device positioning.

Figure 1G:
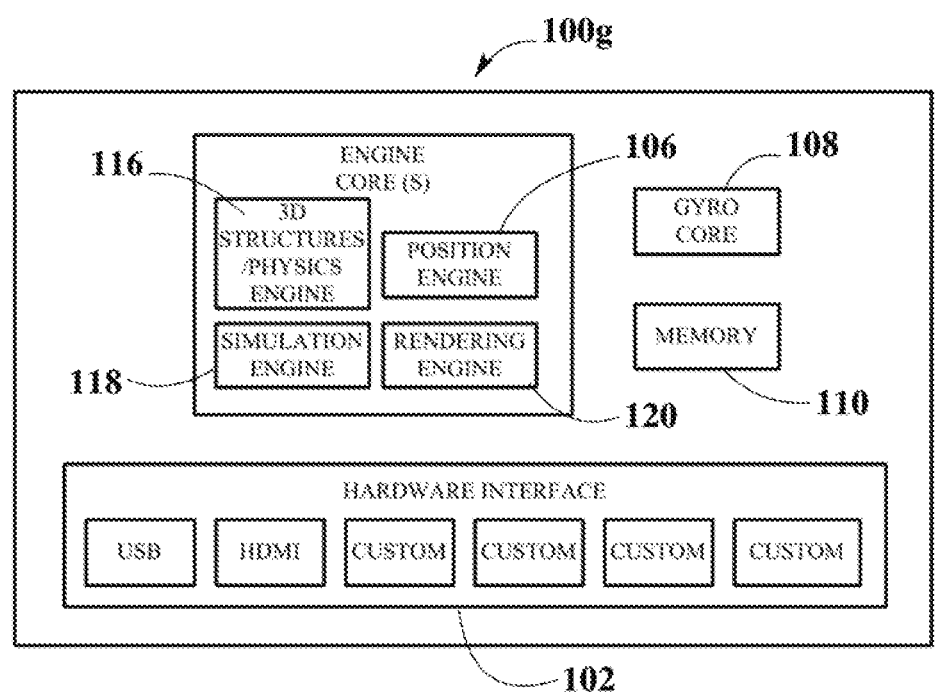

FIG. 1G depicts a data tracking communications chip 100g similar to that of the data tracking communications chip 100f, but where the game and/or simulation engine 104, apart from the 3D structures-and-physics engine 116 and simulation engine 118 described with reference to FIG. 1E, is further subdivided into a dedicated rendering engine 120 implemented on the single engine processing core, the rendering engine 120 being configured to perform rendering tasks on data in order to synthesize images to generate photorealistic 3D models.

Figure 1H:
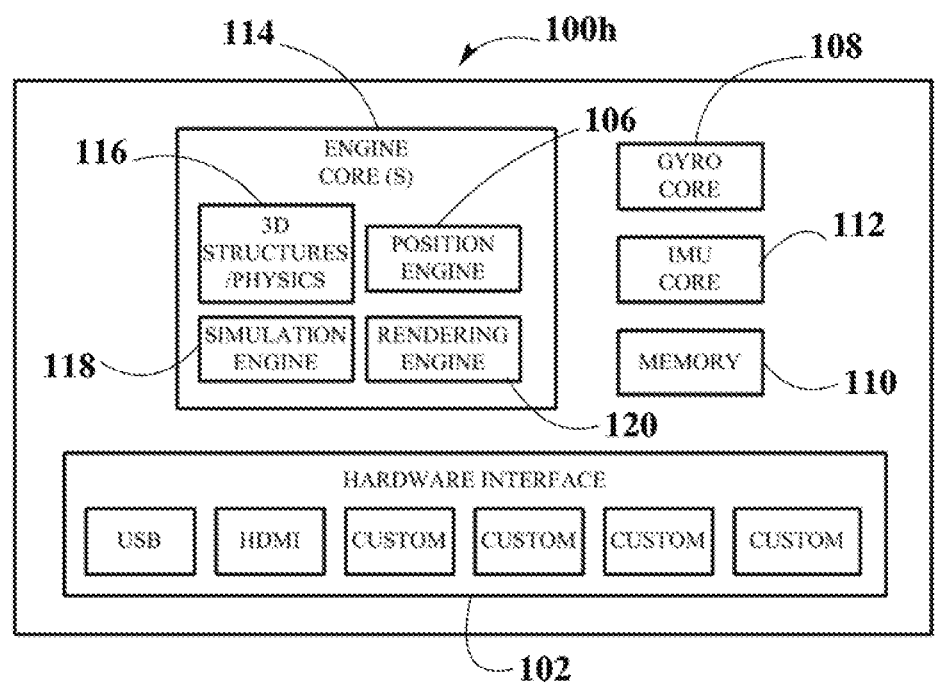

FIG. 1H depicts a data tracking communications chip 100h similar to that of the data tracking communications chip 100g of FIG. 1G, but wherein at least one of the one or more processing cores further implements an IMU 112 with the same functions as those described with reference the IMU 112 of FIG. 1B, providing further 6 DOF position data to the position engine 106 for a more accurate device positioning.

Figure 2A:
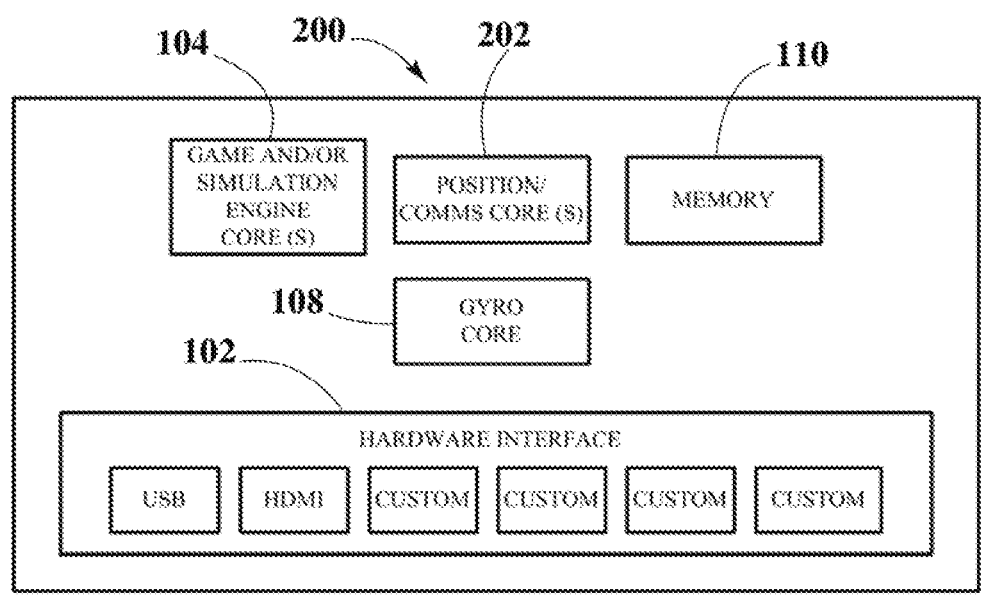
FIGS. 2A-2H illustrate a schematic view of a data tracking communications chip including at least one hardwired game and/or simulation engine, one or more communication units, and one or more gyroscopes, according to one embodiment.
Figure 2B:
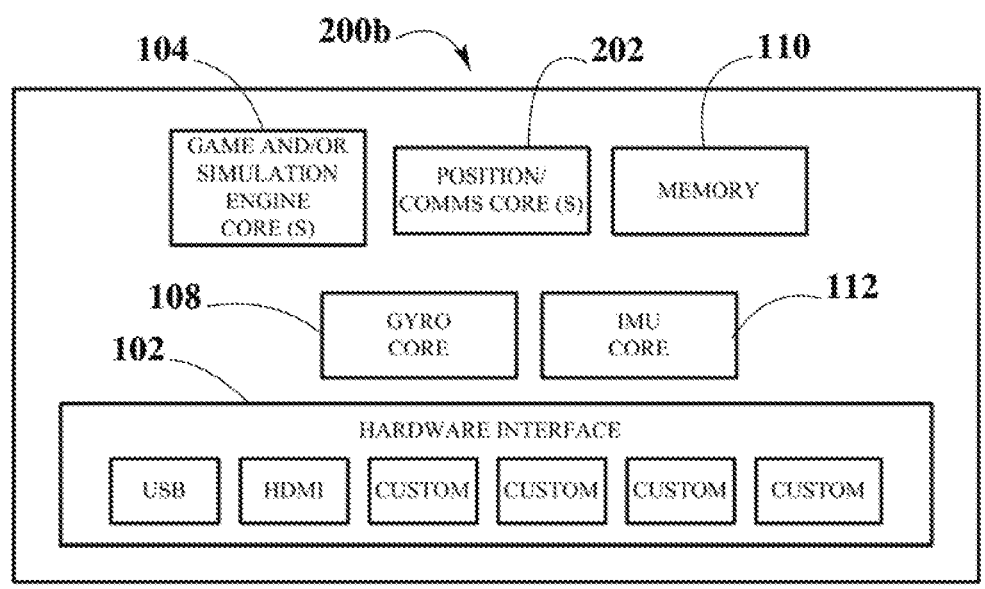
Figure 2C:
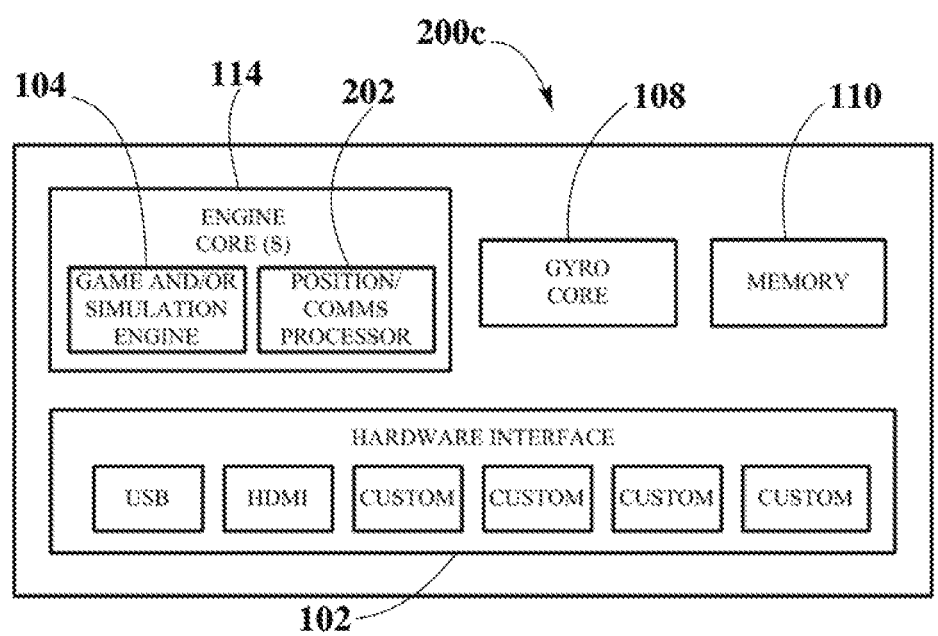
Figure 2D:
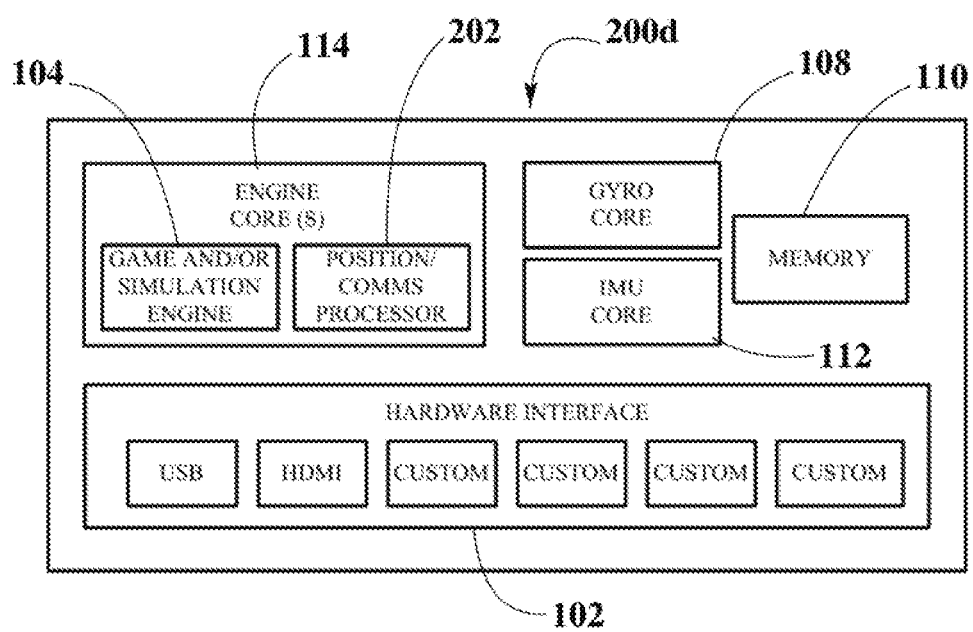
Figure 2E:
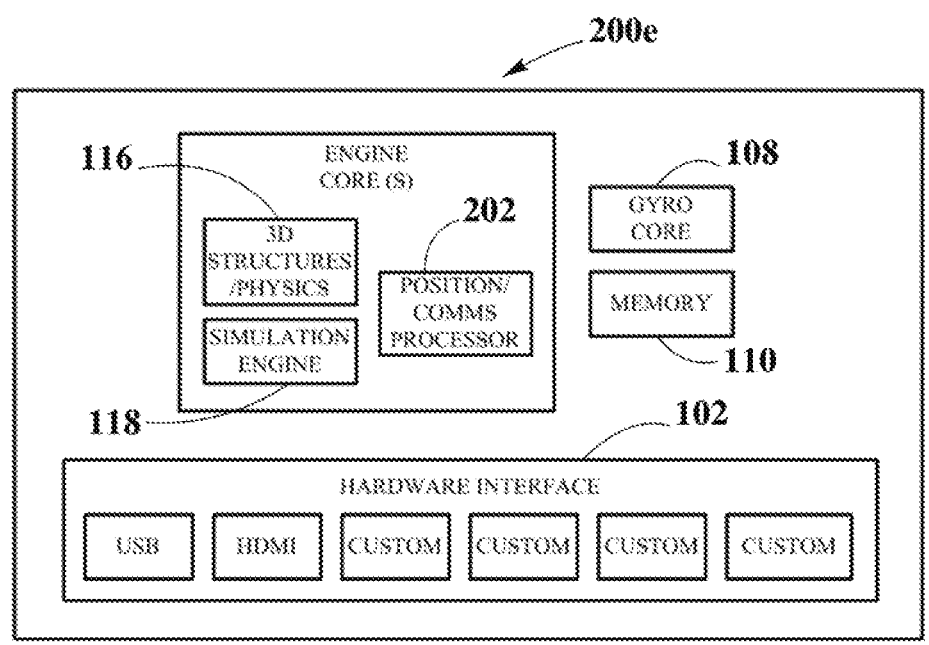
Figure 2F:
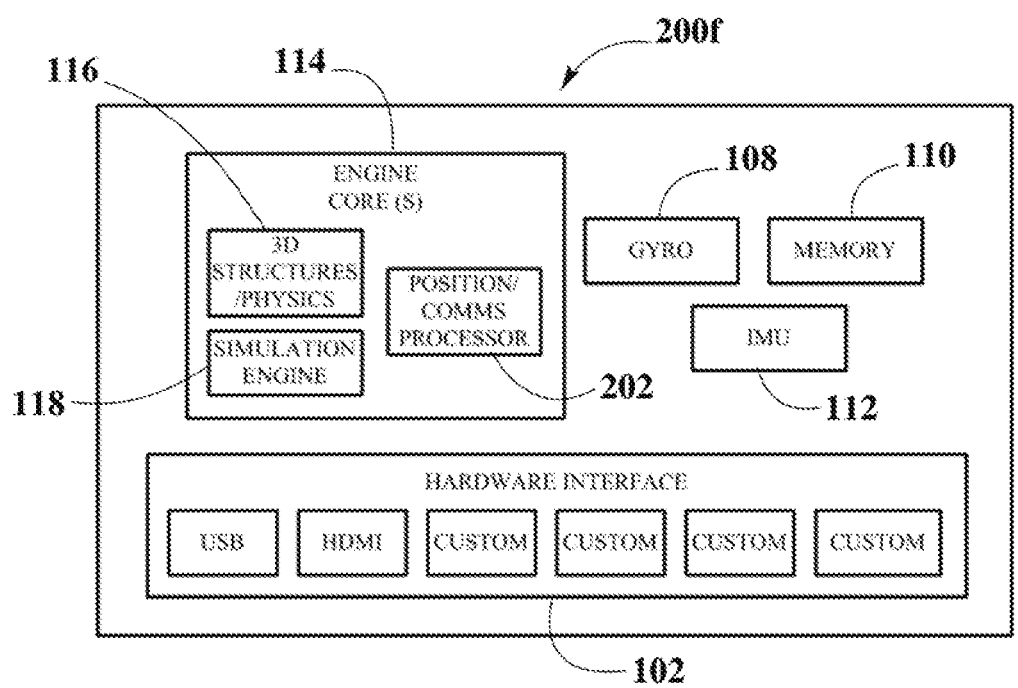
Figure 2G:
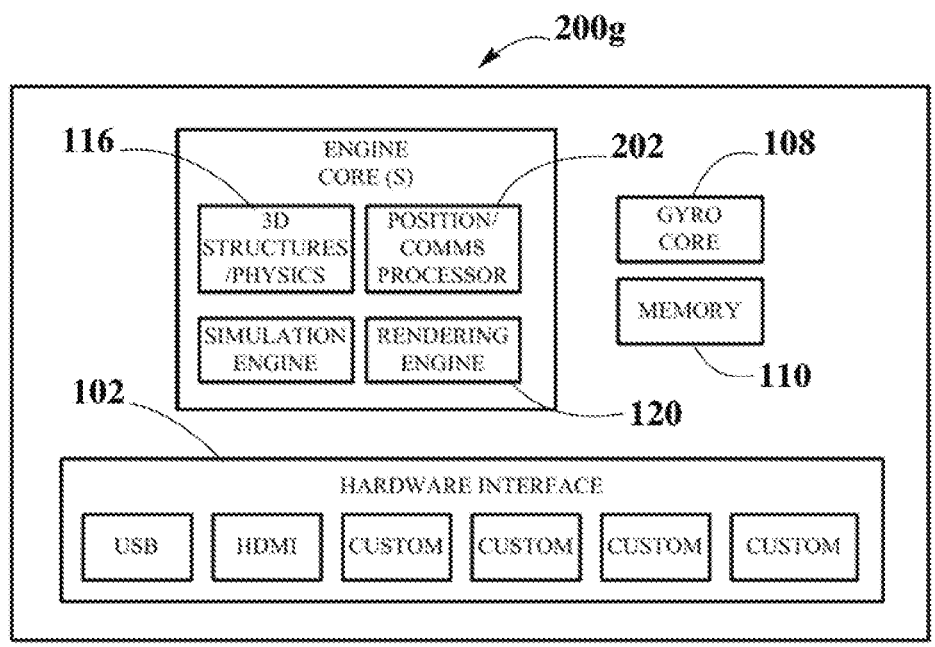
Figure 2H:
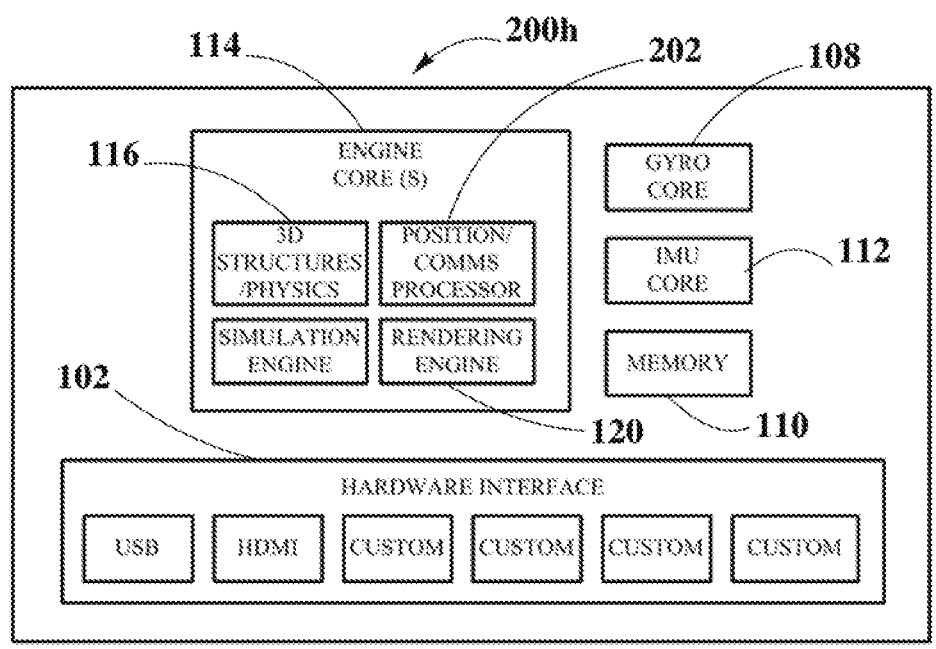

FIGS. 24-2H illustrate schematic views of other embodiments of a data tracking communications chip wherein, instead of a position engine 106 as described with reference to FIGS. 1A-1E, the data tracking communications chip implements, on at least one processing core, a position and communications engine 202. FIGS. 2A-2H may include similar elements as those of FIGS. 1A-1H and may therefore contain the same or similar reference numbers.

FIG. 2A illustrates an embodiment of a data tracking communications chip 200 comprising a plurality of processing cores; and at least one hardware interface 102 coupled to at least one of the plurality of processing cores, wherein at least one of the one or more processing cores implements a position and communications engine 202 configured to receive antenna signals from cellular positioning systems, such as cellular networks, and thereby compute the position of the client device; wherein at least one of the one or more processing cores implements a game and/or simulation engine 104; and wherein one of the one or more processing cores implements a gyroscope 108. According to an embodiment, the data tracking communications chip 200 further comprises a memory 110 configured to store data and to provide the data to one or more processing cores.

The position and communications engine 202 is configured to receive through dedicated hardware (e.g., integrated receivers or transceivers) wireless signals from a cellular positioning system and to compute the positioning of the client device through methods such as ToA, AoA and AoD. Then, the position and communications engine 202 can proceed by refining the positioning data with orientational data from the at least one gyroscope 108 and thus compute a 6 DOF position and orientation of the client device.

The positioning data can be further augmented by positioning data from short range communication systems received by the position and communications engine 202, as described with reference to FIG. 1A. In further embodiments, the 6 DOF position and orientation can be further augmented by a 3D structure of real world objects stored in a virtual world system, by simulation data from the game and/or simulation engine 104, or combinations thereof. Additional functions of each of the other components of the data tracking communications chip 200 (e.g., game and/or simulation engine 104, gyroscope 108, memory 110, and hardware interface 102) may be similar to the functions in the description with reference to FIG. 1A-1H.

In another embodiment, the position and communications engine 202 implements, in hardware, a distributed ledger-based communications pipeline between users of a host device including one or more data tracking communications chips 200 according to embodiments of the current disclosure. The distributed ledger-based communications pipeline may enable direct communication between users through a decentralized network by allowing storage of information in a secure and accurate manner using cryptography, employing cryptographic "keys" and cryptographic signatures. Once the information is stored, the data becomes an immutable database and is governed by rules of the network.

FIG. 2B illustrates an embodiment of a data tracking communications chip 200b, similar to the data tracking communications chip 200 of FIG. 24, where at least one of the one or more processing cores further implements an IMU 112 configured to provide further 6 DOF position and orientation data to the position and communications engine 202 for further refining the positioning data. The functions and features of the IMU 112 may be the same as described with reference to the IMU 112 of FIG. 1B.

FIG. 2C illustrates an embodiment where a data tracking communications chip 200c similar to the data tracking communications chip 200 of FIG. 2A, where at least one of the one or more processing cores implements a game and/or simulation engine 104 with a dedicated position and communications engine 202, where implementations are performed by dedicated electronic circuitry on at least one common processing core, or engine core 114. Providing the game and/or simulation engine 104 and a dedicated position and communications engine 202 on a single, common hardware processing core may reduce processing times by enabling fast communication via short data links. Additionally, implementing a position engine 106 dedicated to a single game and/or simulation engine 104 may improve efficiency because the position engine 106 may only need to process data from the game and/or simulation engine 104 to which the position and communications engine 202 is dedicated. Additional functions of each of the game and/or simulation engine 104 and position and communications engine 202 of the data tracking communications chip 200c and the remaining components (gyroscope 108, memory 110, and hardware interface 102) may be similar to the functions in the description with reference to FIG. 1A.

FIG. 2D illustrates an embodiment where a data tracking communications chip 200d displays the same features as those of the data tracking communications chip 200c of FIG. 2C, but wherein at least one of the one or more processing cores further implements an IMU 112 with the same functions as those described with reference the IMU 112 of FIG. 1B, providing further 6 DOF position data to the position engine 106 for a more accurate device positioning.

FIG. 2E illustrates an embodiment of a data tracking communications chip 200e wherein the game and/or simulation engine 104 described with reference to FIGS. 2A-D is further subdivided into dedicated hardware components comprising a 3D structures-and-physics engine 116 and a simulation engine 118 implemented on the single engine core 114, such as the engine core 114 of described with reference to FIG. 1E, but where the position engine 106 is replaced by a position and communications engine 202.

FIG. 2F illustrates an embodiment of a data tracking communications chip 200f similar to that of the data tracking communications chip 200e of FIG. 2E, but where at least one of the one or more processing cores further implements an IMU 112 with the same functions as those described with reference to the IMU 112 of FIG. 1B, providing further 6 DOF position data to the position and communications engine 202 for a more accurate device positioning.

FIG. 2G depicts a data tracking communications chip 200g similar to that of the data tracking communications chip 200e of FIG. 2E, but where the game and/or simulation engine 104, apart from the 3D structures-and-physics engine 116 and simulation engine 118, is further subdivided into a dedicated rendering engine 120 implemented on the single engine processing core, the rendering engine 120 being configured to perform rendering tasks on data in order to synthesize images to generate photorealistic 3D models.

FIG. 2H depicts a data tracking communications chip 200h similar to that of the data tracking communications chip 200g of FIG. 2G, but wherein at least one of the one or more processing cores further implements an IMU 112 with the same functions as those described with reference the IMU 112 of FIG. 1B, providing further 6 DOF position data to the position and communications engine 202 for a more accurate device positioning.

FIGS. 3A-3H illustrates schematic views of other embodiments of a data tracking communications chip comprising both a position engine and communications unit as separate components.

Figure 3A:
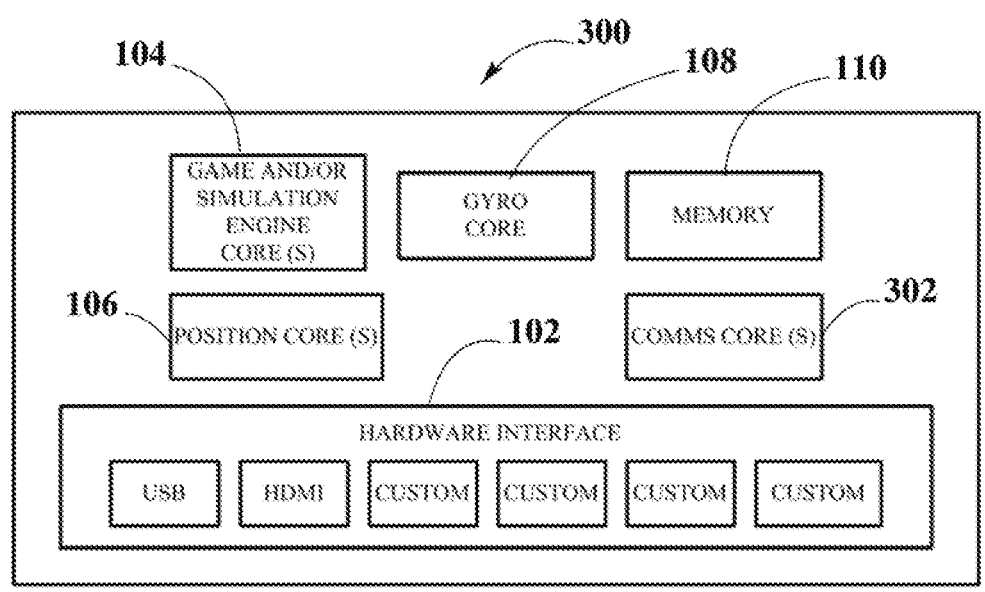
FIGS. 3A-3H illustrate a schematic view of a data tracking communications chip including at least one hardwired game and/or simulation engine, one or more position engines, one or more communication units, and one or more gyroscopes, according to an embodiment.

FIG. 3A illustrates an embodiment of a data tracking communications chip 300 comprising a plurality of processing cores; and at least one hardware interface 102 coupled to at least one of the plurality of processing cores, wherein at least one of the one or more processing cores implements a position engine 106; and wherein at least one of the one or more processing cores implements a communications engine 302; wherein at least one of the one or more processing cores implements a game and/or simulation engine 104; and wherein at least one of the one or more processing cores implements a gyroscope 108. According to an embodiment, the data tracking communications chip 300 further comprises a memory 110 configured to store data and to provide the data to one or more processing cores.

The communications engine 302 is configured to receive and send through dedicated hardware (e.g., receivers, transmitters or transceivers) wireless signals from a cellular positioning system, and to compute the position of a client device implementing the data tracking communications chip 300 through methods such as ToA, AoA and AoD. The wireless signals sent to the communications engine 302 may be transmitted using the architecture of existing cellular communications network, wherein the existing architecture comprises mmW antennas from, for example, a 5G network, and may thus enable connectivity of the client device to a network in order to send and receive data. In other embodiments, the external tracking system is further supported by a 4G cellular communications network. In other embodiments, the communications engine 302 may be further configured to receive and send communication signals from short range communications systems (WLAN, PANs, etc).

In the embodiment of FIG. 34, the position engine 106 may compute an initial position of a client device. Then, the position and communications engine 202 can proceed by refining the positioning data with orientational data from the at least one gyroscope 108 and thus compute a 6 DOF position and orientation of the client device. In further embodiments, the 6 DOF position and orientation can be further augmented by a 3D structure of real world objects stored in a virtual world system, by simulation data from the game and/or simulation engine 104, or combinations thereof. Additional functions of each of the other components of the data tracking communications chip 300 (e.g., position engine 106, game and/or simulation engine 104, gyroscope 108, memory 110, and hardware interface 102) may be similar to the functions in the description with reference to FIG. 1A-1H.

In another embodiment, the communications engine 302 implements, in hardware, a distributed ledger-based communications pipeline between users of a host device including one or more data tracking communications chips 300 according to embodiments of the current disclosure. The distributed ledger-based communications pipeline may enable direct communication between users through a decentralized network by allowing storage of information in a secure and accurate manner using cryptography, employing cryptographic "keys" and cryptographic signatures. Once the information is stored, the data becomes an immutable database and is governed by rules of the network.

Figure 3B:
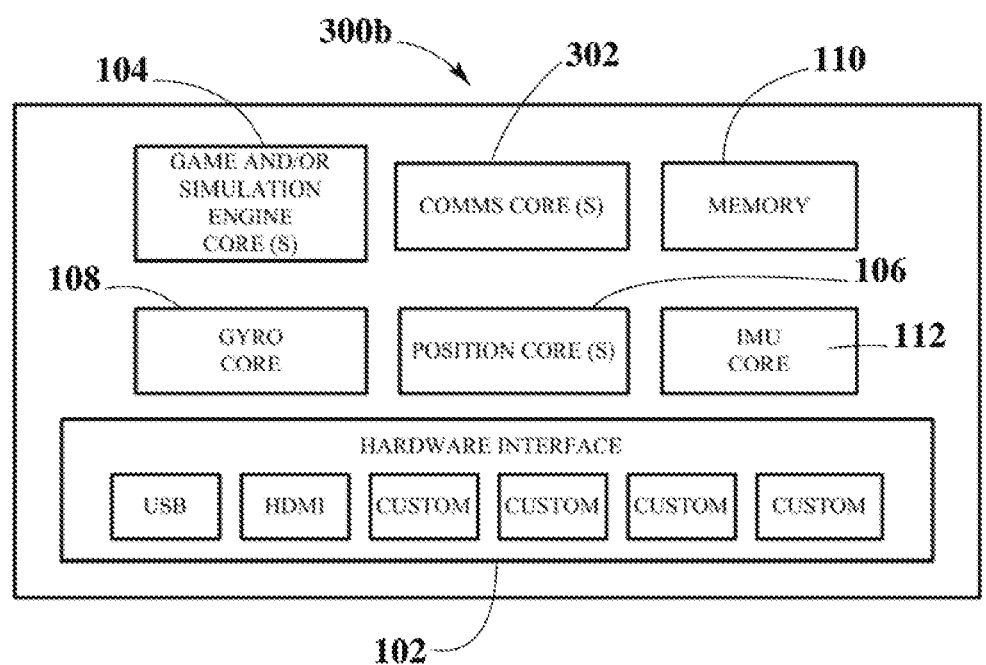

FIG. 3B illustrates an embodiment of a data tracking communications chip 300b similar to the data tracking communications chip 300 of FIG. 3A, where at least one of the one or more processing cores further implements an IMU 112 configured to provide further 6 DOF position and orientation data to the position engine 106 for further refining the positioning data. The functions and features of the IMU 112 may be the same as described with reference to the IMU 112 of FIG. 1B.

Figure 3C:
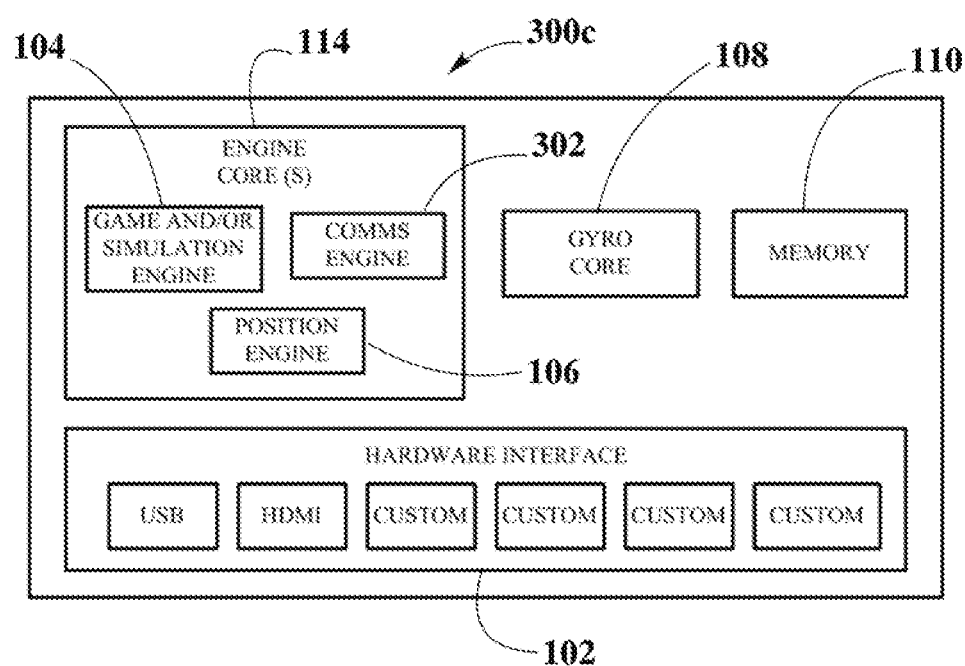

FIG. 3C illustrates an embodiment where a data tracking communications chip 300c similar to the data tracking communications chip 300 of FIG. 34, where at least one of the one or more processing cores implements a game and/or simulation engine 104 with a dedicated position engine 106 and a dedicated communications engine 302 on at least one common processing core, or engine core 114. Providing the game and/or simulation engine 104 and a dedicated position engine 106 and communications engine 302 on a single, common hardware processing core may reduce processing times by enabling fast communication via short data links. Additionally, implementing a position engine 106 dedicated to a single game and/or simulation engine 104 may improve efficiency because the position engine 106 and communications engine 302 may only need to process data from the game and/or simulation engine 104 to which they are dedicated. Additional functions of each of the game and/or simulation engine 104 and position engine 106 of the data tracking communications chip 300c and the remaining components (gyroscope 108, memory 110, and hardware interface 102) may be similar to the functions in the description with reference to FIG. 1A. Additional functions of the communications engine 302 may be similar to those described with reference to FIG. 3A.

Figure 3D:
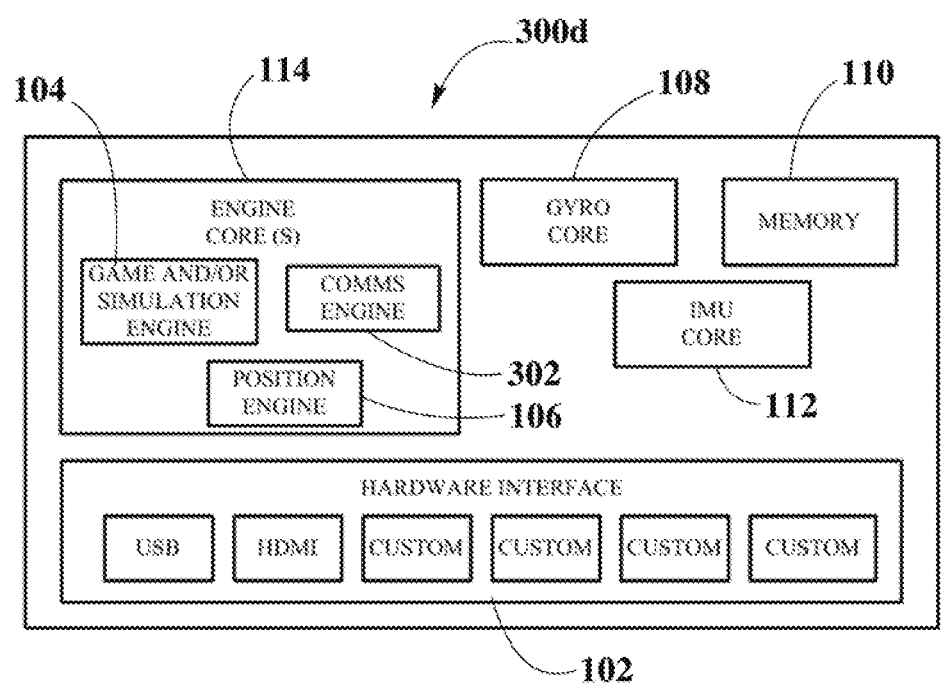

FIG. 3D illustrates an embodiment where a data tracking communications chip 300d displays the same features as those of the data tracking communications chip 300c of FIG. 3C, but wherein at least one of the one or more processing cores further implements an MU 112 with similar functions as those described with reference the IMU 112 of FIG. 1B, providing further 6 DOF position data to the position engine 106 for a more accurate device positioning.

Figure 3E:
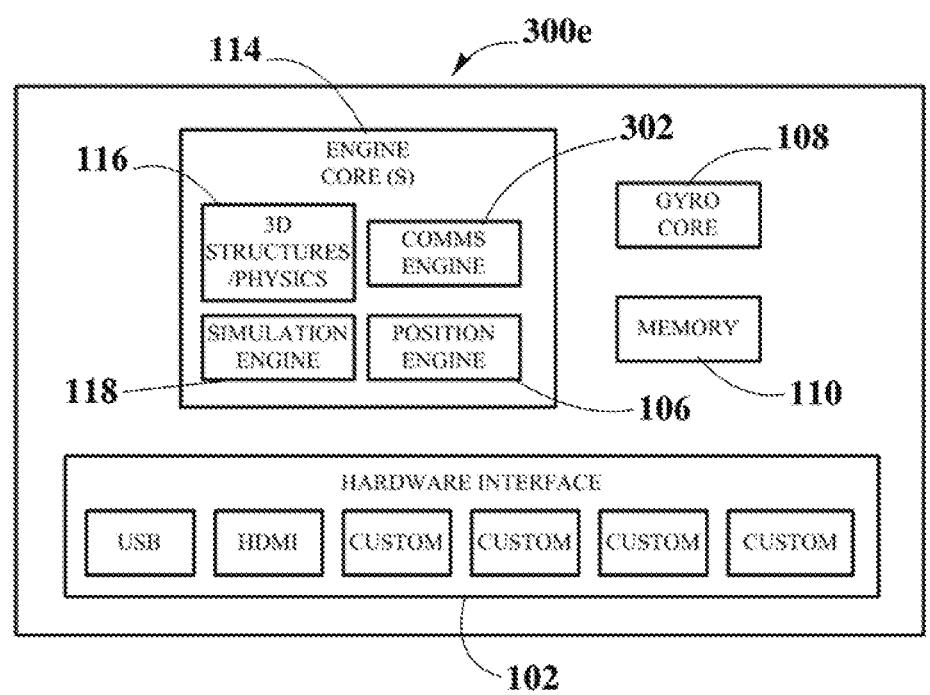

FIG. 3E illustrates an embodiment where a data tracking communications chip 300e where the game and/or simulation engine 104 described with reference to FIGS. 34-3D is further subdivided into dedicated hardware components comprising a 3D structures-and-physics engine 116 and a simulation engine 118 implemented on the single engine core 114, as described with reference to FIG. 1E, but further comprising a communications engine 302 as described with reference to FIG. 3A.

Figure 3F:
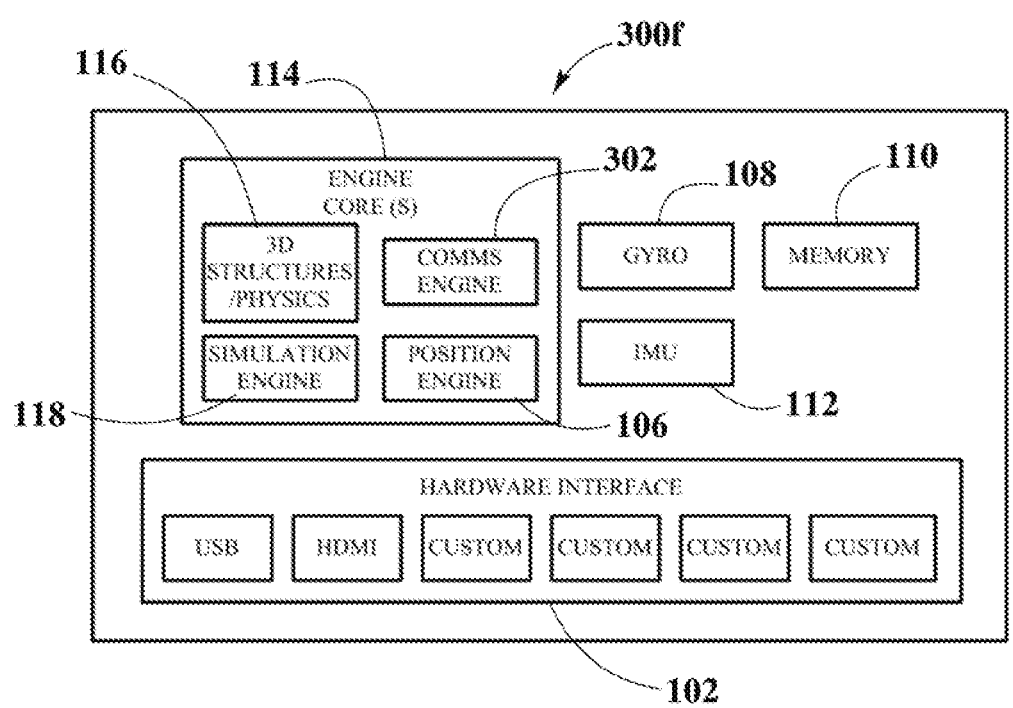

FIG. 3F illustrates an embodiment of a data tracking communications chip 300f similar to that of the data tracking communications chip 300e of FIG. 3E, but where at least one of the one or more processing cores implements an IMU 112 with the same functions as those described with reference to the IMU 112 of FIG. 18, providing further 6 DOF position data to the position engine 106 for a more accurate device positioning.

Figure 3G:
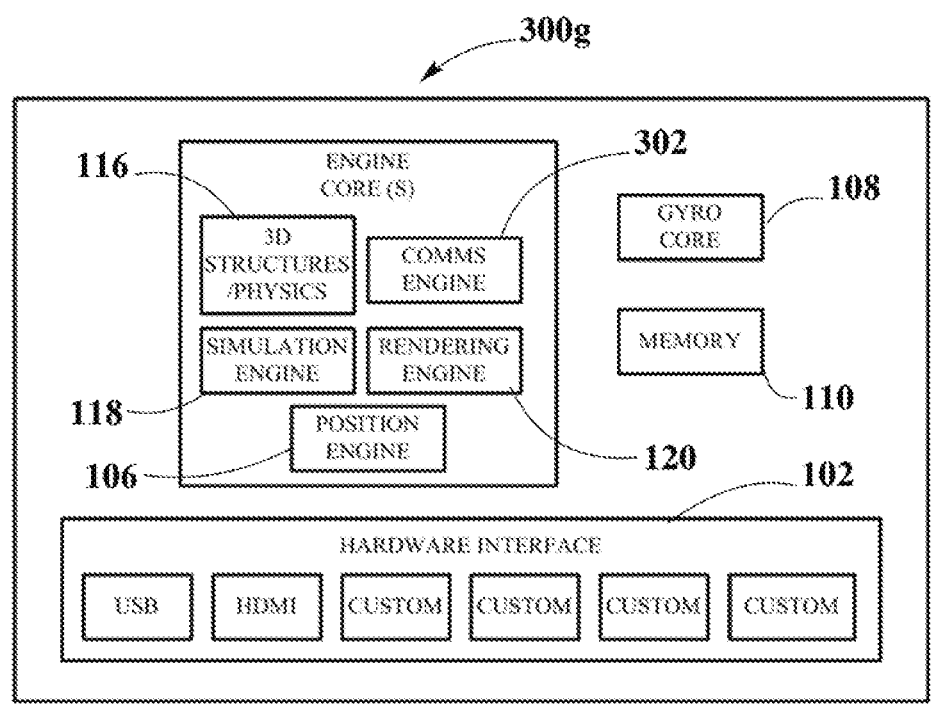

FIG. 3G depicts a data tracking communications chip 300g similar to that of the data tracking communications chip 300e described with reference to FIG. 3E, but where the game and/or simulation engine 104, apart from the 3D structures-and-physics engine 116 and simulation engine 118, is further subdivided into a dedicated rendering engine 120 implemented on the single engine processing core, the rendering engine 120 being configured to perform rendering tasks on data in order to synthesize images to generate photorealistic 3D models.

Figure 3H:
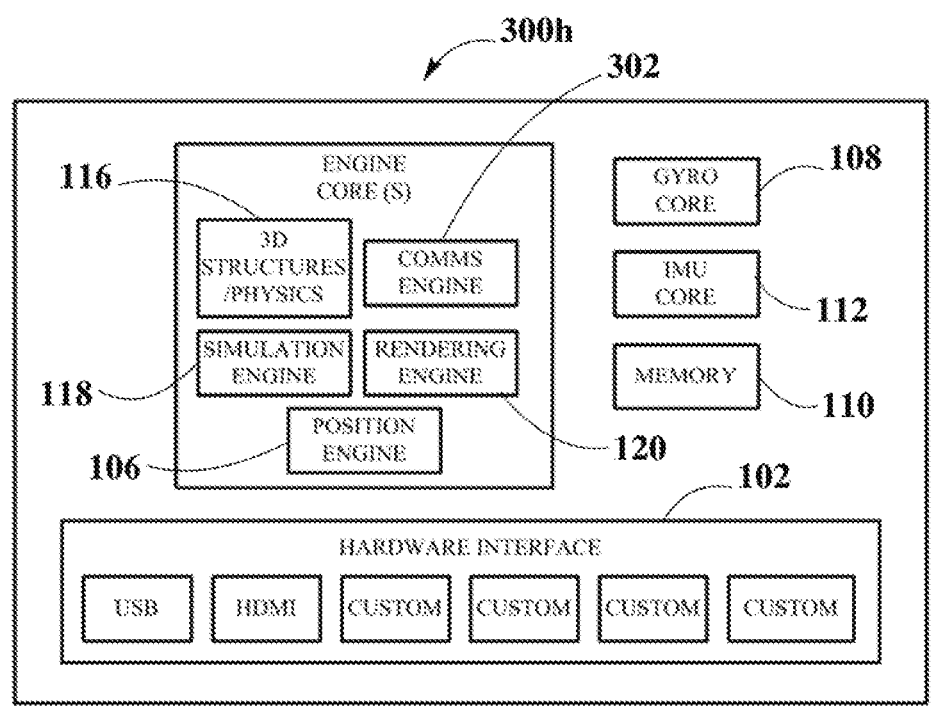

FIG. 3H depicts a data tracking communications chip 300k similar to that of the data tracking communications chip 300g of FIG. 3G, but wherein at least one of the one or more processing cores further implements an IMU 112 with the same functions as those described with reference the IMU 112 of FIG. 1B, providing further 6 DOF position data to the position and communications engine 202 for a more accurate device positioning.

In the embodiments above with reference to FIGS. 1A-3H, the computed 6 DOF position and orientation can be shared through either of the at least one hardware interface 102, position engine 106 through the GNSS network, or through the communications engine 302 or the position and communications engine 202 using the cellular networks or short range communication systems.

Figure 4A:
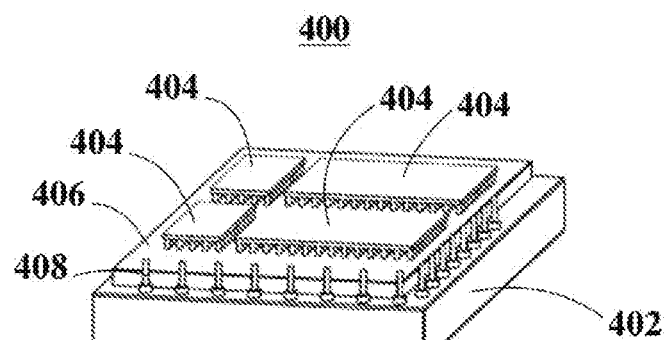
FIGS. 4A-4C illustrate various examples of chip assemblies according to embodiments of the present disclosure.
Figure 4B:
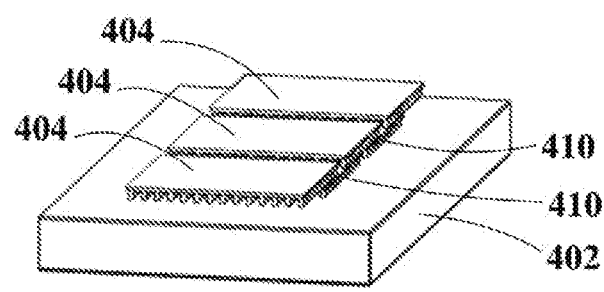
Figure 4C:
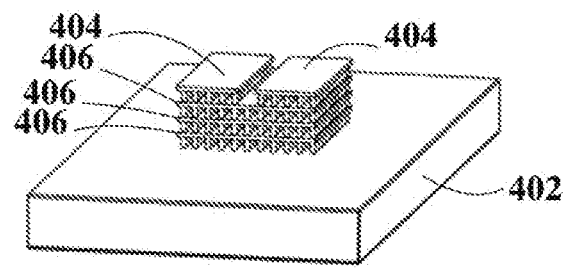

FIGS. 4A-4C illustrate various examples of chip assemblies according to embodiments of the present disclosure.

The chip assemblies 400 may include a package substrate 402, a plurality of sub-chips 404, and an interposer 406. The chip assembly 400 may be configured on the package substrate 402 via the interposer 406. The plurality of sub-chips 404 may together constitute the data tracking communications chip according to embodiments of the present disclosure and the plurality of sub-chips 404 may be interconnected via the interposer 406. The interposer 406 may itself be a large silicon die with metal interconnect layers that may be produced with chip production equipment. The metal interconnect layers on the interposer 406 may replace the interconnection layers that otherwise would interconnect various areas of a single chip.

In one embodiment shown in FIG. 4A the interposer 406 can be connected to the package substrate 402 using through-silicon-vias 408.

FIG. 4B shows yet another embodiment of a chip assembly 400 using another method of interconnecting the plurality of sub-chips 404 into a single data tracking communications chip. In this exemplary embodiment, the various sub-chips 404 may be integrated into the chip assembly using micro-bridges 410 that may be embedded in the package substrate 402. The micro-bridges 410 may be themselves silicon dies with metal interconnect layers produced by chip production equipment. The metal interconnect layers on the micro-bridges 410 may replace the interconnection layers that otherwise would interconnect various areas of a single chip.

FIG. 4C shows yet another example embodiment of a chip assembly 400. In this example embodiment, the plurality of sub-chips 404 may be interconnected vertically into the chip assembly, placed on the package substrate 402. This may also be referred to as 3D chip stacking. Interconnecting sub-chips 404 vertically may use, for example, throughsilicon-vias, such as the through-silicon-vias 408 of FIG. 4A, or use inductive coupling technology to enable near field wireless communication between 3D stacked chips.

Figure 5A:
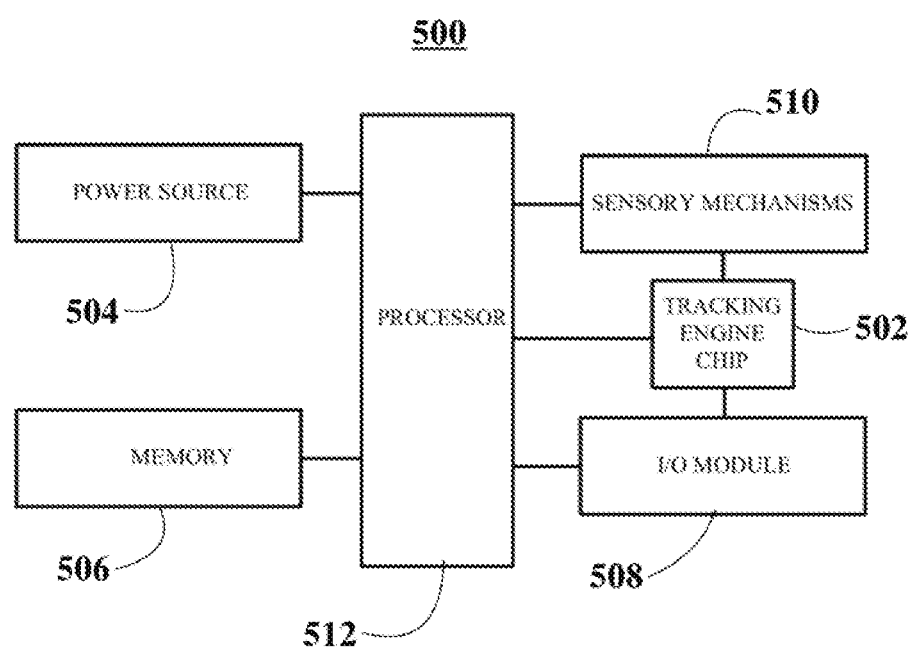
FIGS. 5A-5B illustrate a computing device implementing an electronic chip of the current disclosure.
Figure 5B:
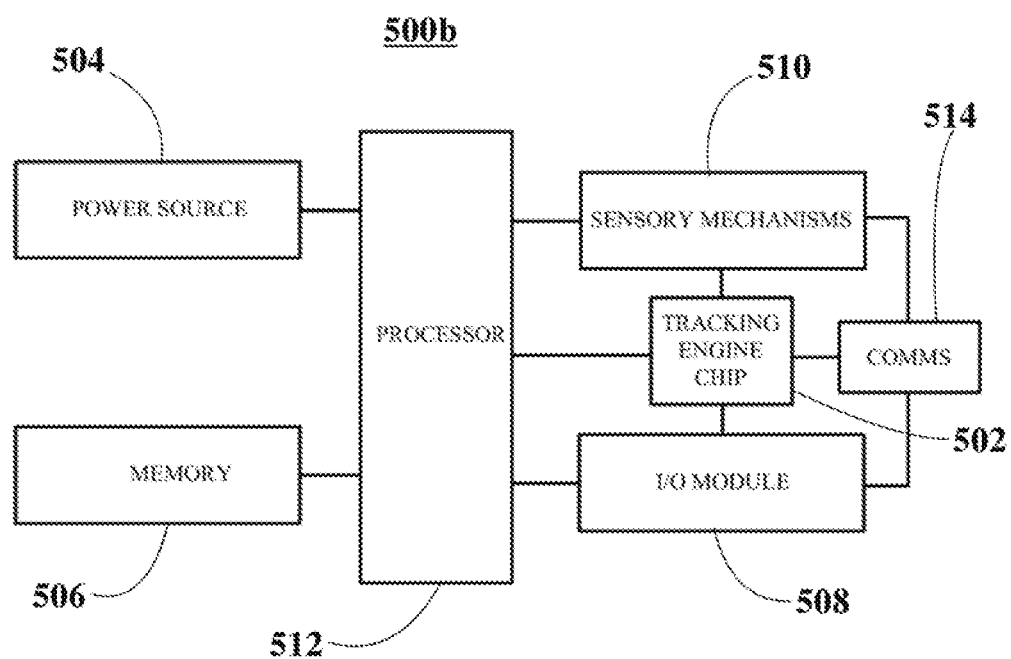

FIGS. 5A-5B illustrates a client device 500 implementing a data tracking communications chip of the current disclosure.

The client device 500 of FIG. 5A includes at least one data tracking communications chip 502 (which may also be referred to as a tracking engine chip) or chip assembly according to embodiments of the current disclosure, a power source 504, a memory 506 an I/O module 508, and sensing mechanisms 510, all communicatively connected to a host processor 512. The data tracking communications chip 502 or chip assembly may thus be used to support the host processor 512 by performing game and/or simulation engine tasks driven by an accurate positioning through the position engine of the data tracking communications chip 502 as disclosed. The client device 500 may be a mobile computing device, a head-mounted display, a personal computer, a game console, a server computer, and the like.

The power source 504 is implemented as computing hardware configured to provide power to the client device 500. In one embodiment, the power source 504 may be a battery. The power source 504 may be built into the client device 500 or removable from the client device 500, and may be rechargeable or non-rechargeable. In one embodiment, the client device 500 may be repowered by replacing one power source 504 with another power source 504. In another embodiment, the power source 504 may be recharged by a cable attached to a charging source, such as a universal serial bus ("USB") FireWire, Ethernet, Thunderbolt, or headphone cable, attached to a personal computer. In yet another embodiment, the power source 504 may be recharged by inductive charging, wherein an electromagnetic field is used to transfer energy from an inductive charger to the power source 504 when the two are brought in close proximity, but need not be plugged into one another via a cable. In another embodiment, a docking station may be used to facilitate charging.

The memory 506 may be implemented as computing software and hardware adapted to store application program instructions of the client device 500 from the sensing mechanisms 510 or from data input by users through the I/O module 508. The memory 506 may be of any suitable type capable of storing information accessible by the host processor 512 and data tracking communications chip 502, including a computer-readable medium, or other medium that stores data that may be read with the aid of an electronic device, such as a hard-drive, memory card, flash drive, ROM, RAM, DVD or other optical disks, as well as other write-capable and read-only memories. The memory 506 may include temporary storage in addition to persistent storage.

The I/O module 508 of the client device 500 may be implemented as computing hardware and software configured to interact with users and provide user input data to one or more other system components. For example, I/O module 508 may be configured to interact with users, generate user input data based on the interaction, and provide the user input data to the data tracking communications chip 502 and host processor 512. In another example, I/O modules 508 is implemented as an external computing pointing device (e.g., a touch screen, mouse, 3D control, joystick, gamepad, and the like) and/or text entry device (e.g., a keyboard, dictation tool, and the like) configured to interact with client device 500. In yet other embodiments, I/O module 508 may provide additional, fewer, or different functionality to that described above.

The sensing mechanisms 510 may be implemented as computing software and hardware adapted to obtain various data from users in addition to the sensor data obtained by sensors already implemented in the data tracking communications chip 502. The sensing mechanisms 510 may include, without limitations, one or more of an Inertia Measuring Unit (IMU), accelerometers, gyroscopes, light sensors, haptic sensors, cameras (e.g., depth cameras), eye-tracking sensors, and microphones, amongst others. The IMU, accelerometers, or gyroscopes may provide further positioning data to the data tracking communications chip 502. The light sensors, haptic sensors, camera, eye-tracking sensors, and microphone may be used to capture input details from a user and his or her environment, which may be transmitted to the host processor 512 and/or data tracking communications chip 502 for further processing.

The host processor 512 may be implemented as computing hardware and software configured to receive and process sensor data and 3D application data and instructions, processing of which may be supported by the data tracking communications chip 502. For example, the host processor 512 may be a host CPU or GPU configured to perform imaging requests, receive imaging data, process imaging data into environment or other data, process user input data and/or imaging data to generate user interaction data, perform edge-based (on-device) machine learning training and inference, provide server 610 requests, receive server 610 responses, and/or provide user interaction data, environment data, and content object data to one or more other system components. For example, the host processor 512 may receive user input data from I/O module 508 and may respectively implement application programs stored in the memory 506. In other examples, the host processor 512 may perform edge-based rendering of media streams received from the engine platform server 610 while executing the 3d applications. In other examples, the host processor 512 may receive media streams rendered by the engine platform server 610, and may perform lightweight operations on the media streams in order to output the media streams.

The client device 500b of FIG. 5B comprises at least one data tracking communications chip 502 or chip assembly according to embodiments of the current disclosure, a host processor 512, a power source 504, a memory 506, an I/O module 508, sensing mechanisms 510, and a communications engine 514. The data tracking communications chip 502 or chip assembly may thus be used to support the host processor 512 by performing game and/or simulation engine tasks and machine learning algorithms as disclosed. The client device 500 may be a mobile computing device, a head-mounted display, a personal computer, a game console, a server 610 computer, and the like.

The client device 500b, unlike the client device 500, further comprises dedicated hardware circuitry and/or software implementing a communications engine 514 which may function as described with reference to FIGS. 3A-3H.

The client devices 500 and 500b may comprise further components not illustrated in FIG. 5A-5B.

Figure 6:
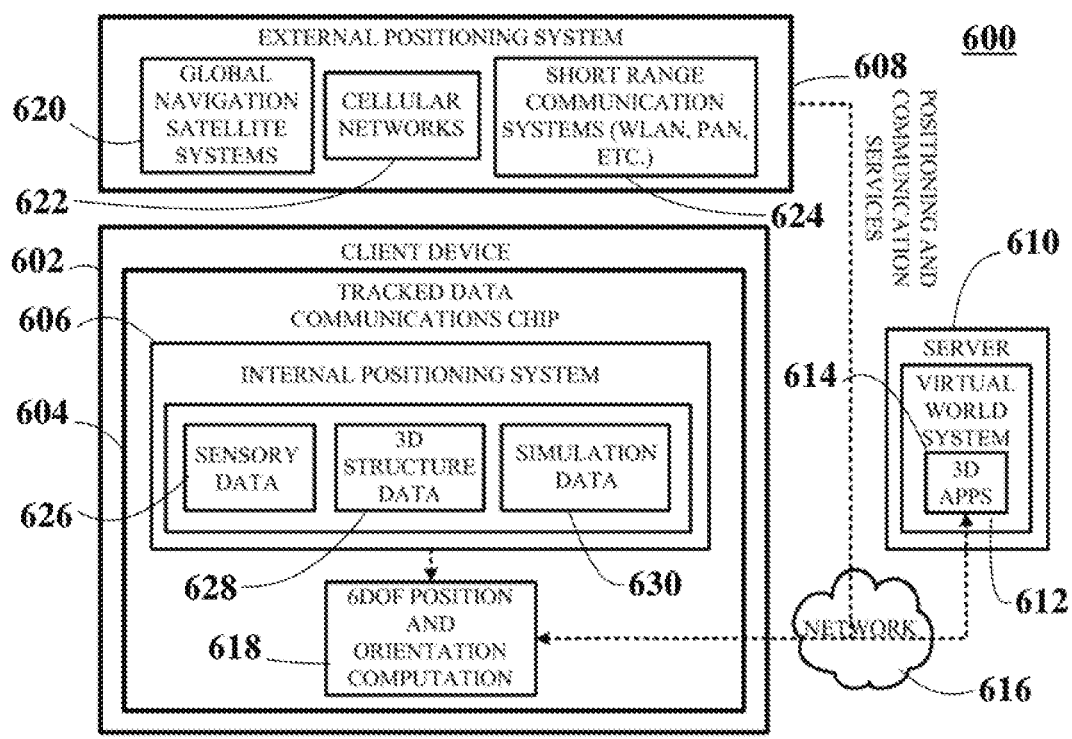
FIG. 6 illustrates a schematic view of a system for enabling data tracking communications, according to an embodiment.

FIG. 6 illustrates a schematic view of a system 600 for enabling tracked data communications, according to an embodiment.

According to an embodiment, a system 600 enabling tracked data communications comprises at least one client device 500 implementing one or more data tracking communications chips 604 comprising an internal positioning system 606; an external positioning system 608; and a server 610 storing and computing a virtual world system 612 hosting at least one 3D application 614, the client device 500, external positioning system 608, and server 610 being communicatively connected via a network 616, wherein the data tracking communications chip 604 computes and refines the client device 6 DOF position and orientation 618 by using positioning data from the external positioning system 608 and internal positioning system 606, thereby driving the operations of 3D applications hosted in the server 610.

The external positioning system 608 may comprise one or more global navigation satellite systems (GNSS) 620, cellular networks 622, and short range communication systems 624. The GNSS 620 comprises a network of satellites used for global positioning of devices. Employing signals from a sufficient number of satellites and techniques such as triangulation and trilateration, GNSS 620 can calculate the position, velocity, altitude, and time of devices. The GNSS 620 may comprise one or more of several satellite systems, such as GPS, BDS, Glonass, QZSS, Galileo, and IRNSS. The GNSS systems 600 may comprise a constellation of satellite equipped with at least one atomic clock, radio receivers and transmitters, special antennas, one or more computers and small thrusters used for course corrections. GNSS systems 600 may comprise a control segment and a user segment. The control segment comprises global ground stations that track the satellites and then send commands and data to the constellation such as corrected orbital and time information, so that they ensure a continuous operation of the space segment. The user segment comprises receiver equipment and computational techniques to calculate the PVT data of a client device, computations which are performed by the data tracking communications chip 604.

Positioning signals from the GNSS 620 are received by the data tracking communications chip 602 through hardware such as receivers or transceivers, thereafter implementing algorithms on the received signals for computing the position of the client device 500. The data tracking communications chip 604 may further receive wireless signals from the cellular networks 622 and thereby refine the positioning data through techniques known in the art, such as TOA, AoA and AoD. The cellular networks 622 may comprise 5G networks, and may be supported a 4G cellular communications network.

The data tracking communications chip 604 may receive further wireless signals from short range communication systems 624 in order to further refine the client device positioning. The short range communication systems 624 may comprise systems such as WLAN (e.g., Wi-Fi), PAN (e.g., Bluetooth and Zigbee), and the like. In some embodiments. Wi-Fi provides data at 60 GHz. In alternative embodiments, the GNSS 620 is augmented via other techniques known in the art, such as via differential GPS (DEPS), satellite-based augmentation systems (SBASs), real-time kinematic (RTIC) systems.

The sensor data 626 may be used to further refine the positioning computed by the data tracking communications chip 604 using data from the external positioning system 608. The internal positioning system 606 comprises sensor data 626, 3D structure data 628, and simulation data 630. The sensor data 626 refers to data, such as inertial data, obtained through sensing mechanisms which, in some embodiments, are either integrated in the data tracking communications chip 602, such as the gyroscopes and or communicatively connected to the data tracking communications chip 602 via the at least one hardware interface, such as light sensors, haptic sensors, cameras (depth cameras), eye-tracking sensors, and microphones.

The 3D structure data 628 may be used to further refine the positioning computed by the data tracking communications chip 604 from the external positioning system 608 and sensor data 626. The 3D structure data 628 refers to the arrangement of data of virtual replicas of the real world into 3D structures, which may include geo-location data of each of the virtual replicas in the virtual world system 612 stored and computed on the server 610, complementing existing positioning data obtained by the external positioning system 608 or sensor data 626. The 3D structure data 628 may be arranged through data algorithms in order to determine a faithful approximation of a given surface's geometry and processing of images into suitable data structures (e.g., octrees, quadtrees, BSP trees, sparse voxel octrees, 3D arrays, and k-d trees).

The simulation data 630 may be used to further refine the positioning computed by the data tracking communications chip 604 from the external positioning system 608, sensor data 626 and 3D structure data 628. The simulation data 630 may be the result of simulated existing position and orientation data or position and orientation data that have been further predicted for the near future.

In some embodiments, the virtual world system 612 comprises the digital version of the real-world, including real-world coordinates, such as position, orientation, scale and dimension of real-world objects, the physical properties, and the 3D structure of each of the real objects in the form of real-time 3D virtual replicas. The 3D applications 614 are thus positioned in the virtual world system 612 relative to the virtual replicas of the real world.

The server 610 may further store a content or virtual replica editor (not shown) configured to enable users to create and edit the real-time 3D virtual replicas of the real object. However, the virtual world system 612 may further include computer-generated virtual objects that may not exist in the real world, such as objects that are purely virtual. The virtual replicas of the real world created through the content editor may be accessed by devices including a data tracking communications chip 604 of the current disclosure through the network 616, and thus may provide the chip with 3D structure data 628 of objects in the real world for positioning data augmentation techniques herein described.

According to an embodiment, the replica editor (not shown) stored in the server 610 comprises software and hardware configured to enable users to model and edit the real-time 3D virtual replicas of the real objects. The replica editor may be, for example, a computer-aided drawing (CAD) software that may store data and instructions necessary to input and edit virtual replicas. The replica editor may enable the input of explicit data and instructions that relate to each digital replica, which may include data and instructions that describe the shape, location, position and orientation, physical properties, 3D structure, and the expected functioning and impact of each real-time 3D virtual replica and the virtual world system 612 as a whole. Generally, the explicit data may include data that may not be obtained by the sensing mechanisms but which instead may need to be input digitally through the replica editor, such as building materials, wall thicknesses, electric installations and circuitry, water pipes, fire extinguishers, emergency exits, window locations, machine performance parameters, machine sensor and valve locations, etc.

Modeling techniques for converting real objects into real-time 3D virtual replicas with explicit data and instructions and make them available in the virtual world system 612 may be based on readily-available CAD or CAE models of the real objects. For example, machine owners may provide to an administrator of the virtual world system 612, or may input themselves, the already-existing digital CAD or CAE models of their machines. Similarly, building owners may provide building information models (BIM) with building details to be stored in the virtual world system 612 in the server 610, which may include information that may not be visible or easily obtainable via sensing mechanisms. In these embodiments, the owners of these real objects may be responsible for adding the respective real-time 3D virtual replicas into the virtual world system 612, which may be achieved, for example, through incentive systems or by legal requirements. In some embodiments, the administrators of the virtual world system 612, government officials, or other relevant authorities, may collaborate with owners of real objects for inputting the real-time 3D virtual replicas into the virtual world system 612, thereby realizing a faster and more thorough creation of the virtual world system 612 in the server 610. In other embodiments, radar-imaging, such as synthetic-aperture radars, real-aperture radars, AVTIS radars, Light Detection and Ranging (LIDAR), inverse aperture radars, monopulse radars, and other types of imaging techniques may be used to map and model real objects before integrating them into the virtual world system 612. Independent of the modeling techniques used for creating the virtual replicas, the information of each virtual replica should provide sufficient details about each corresponding real world element so that a highly accurate real-time 3D virtual replica of each real world object is available.

The computed 6 DOF position and orientation can be shared through either of the at least one hardware interface 102, position engine 106 through the GNSS 620, or through the communications engine or the position and communications engine using the cellular networks 622 or short range communication systems 624.

Figure 7:
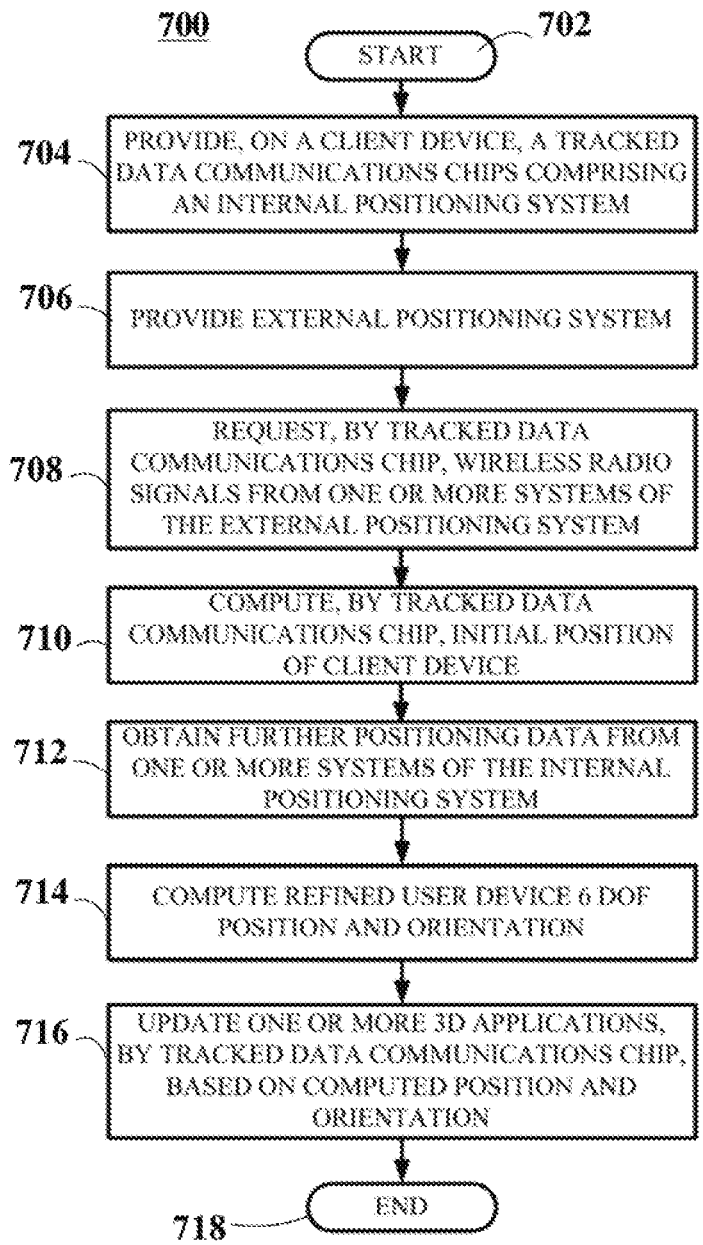
FIG. 7 illustrates a method enabling data tracking communications, according to an embodiment.

FIG. 7 illustrates a method 700 enabling tracked data communications, according to an embodiment. Method 700 may be implemented by a system such as system 600 of FIG. 6 employing one or more data tracking communications chips or chip assemblies as described with reference to FIGS. 1A-4C.

Method 700 may begin by providing, on a client device, at least one data tracking communications chip comprising an internal positioning system, as viewed in blocks 702 and 704. The method 700 proceeds in block 706 by providing an external positioning system, and then by requesting, by the data tracking communications chip, wireless radio signals from one or more systems of the external positioning system, as viewed in block 708. The method 700 continues by computing, by the data tracking communications chip, the initial position of the client device, as viewed in block 710.

In block 712, the method 700 continues by obtaining further positioning data from one or more systems of the internal positioning system, and then by computing a refined user device 6 DOF position and orientation, as viewed in block 714.

Finally, method 700 may end in blocks 716 and 718 by updating one or more 3D applications, by the data tracking communications chip, based on computed 6 DOF position and orientation.

In some embodiments, the method 700 further comprises sharing, by the data tracking communications chip, the computed 6 DOF position and orientation, which may be done through either of the at least one hardware interface, position engine through the GNSS network, or through the communications engine or the position and communications engine using the cellular communications network or short range communication systems.

In an embodiment, a chip or system comprising an internal positioning system (e.g., internal positioning system 606, as shown in FIG. 6) performs a method including requesting wireless radio signals from one or more external positioning systems (e.g., one or more of the external positioning systems 608, as shown in FIG. 6); computing an initial position of a client device (e.g., client device 602, as shown in FIG. 6) using the internal positioning system, wherein the initial position of the client device is computed based at least in part on data obtained from the wireless radio signals; refining the initial position of the client device by computing a 6 DOF position and orientation of the client device; and updating one or more 3D applications (e.g., 3D applications 612, as shown in FIG. 6) based on the computed 6 DOF position and orientation of the client device.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

The invention claimed is:

1. A chip comprising:
   a plurality of processing cores; and
   at least one hardware interface coupled to at least one of the plurality of processing cores,
   wherein at least one of the plurality of processing cores includes an on-chip first engine comprising at least one game engine or simulation engine,
   wherein at least one of the plurality of processing cores includes an on-chip position engine,
   wherein at least one of the plurality of processing cores includes at least one on-chip gyroscope core,
   wherein the on-chip position engine is configured to obtain first positioning data from a global navigation satellite system (GNSS) and compute, through one or more hardwired algorithms, an initial position and orientation of a client device, and
   wherein the on-chip position engine is configured to augment the initial position and orientation based on second positioning data received from a cellular positioning system via the at least one hardware interface, based on third positioning data received from one or more short range communication systems, and based on orientational data received from one or more gyroscopes, and by performing virtual world system computations, obtaining a refined 6 degrees of freedom (6 DOF) position and orientation used in operations of one or more 3D applications executed by the on-chip first engine,
   wherein the on-chip first engine and the on-chip position engine are coupled into a single engine processing core, and wherein the on-chip position engine is dedicated to the on-chip first engine such that the on-chip position engine is only used for processing data relating to the on-chip first engine to which it is dedicated.

2. The chip of claim 1, further comprising a memory, wherein one or more of the plurality of processing cores are configured to generate position and orientation data and to provide the data to the on-chip position engine via the memory.

3. The chip of claim 1, wherein one or more of the plurality of processing cores implement one or more of a CPU or GPU configured to assist in processing of the on-chip first engine and the on-chip position engine.

4. The chip of claim 1, wherein at least one of the plurality of processing cores implements an inertia measuring unit (IMU) configured to obtain further 6 DOF positioning data.

5. The chip of claim 1, wherein the on-chip first engine is subdivided into dedicated hardware components comprising one or more of a 3D structures-and-physics engine, a simulation processor or a dedicated rendering engine implemented on the single engine processing core.

6. The chip of claim 1, wherein the first positioning data, the second positioning data, the third positioning data, the orientational data, and the virtual world system computations enable different, complementary positioning update rates.

7. The chip of claim 1, wherein the chip is configured to share computed 6 DOF positioning data through either of the on-chip position engine through the GNSS network, or through the at least one hardware interface using a cellular communications network or the one or more short range communication systems.

8. The chip of claim 1, wherein at least one of the plurality of processing cores implements a communications engine, and wherein the second positioning data and the third positioning data are received via the communications engine.

9. A chip comprising:
a plurality of processing cores; and
at least one hardware interface coupled to at least one of the plurality of processing cores,
wherein at least one of the plurality of processing cores includes an on-chip first engine comprising at least one game engine or simulation engine and an on-chip position and communications engine,
wherein at least one of the plurality of processing cores includes at least one on-chip gyroscope core,
wherein the on-chip position and communications engine is configured to obtain first positioning data from a cellular positioning system via the at least one hardware interface and compute an initial position and orientation of a client device,
wherein the on-chip position and communications engine is configured to augment the initial position and orientation based on second positioning data received from one or more short range communication systems and orientational data received from one or more gyroscopes, and by performing virtual world system computations, obtaining a refined 6 degrees of freedom (6 DOF) position and orientation used in operations of one or more 3D applications executed by the on-chip first engine,
wherein the on-chip first engine and the on-chip position and communications engine are coupled into a single engine processing core, and wherein the on-chip position and communications engine is dedicated to the on-chip first engine such that the on-chip position and communications engine is only used for processing data relating to the on-chip first engine to which it is dedicated.

10. The chip of claim 9, further comprising a memory, wherein one or more of the plurality of processing cores are configured to generate position and orientation data and to provide the position and orientation data to the on-chip position and communications engine via the memory.

11. The chip of claim 9, wherein at least one of the plurality of processing cores implements an inertia measuring unit (IMU) configured to obtain further 6 DOF positioning data.

12. The chip of claim 9, wherein the on-chip first engine is subdivided into dedicated hardware components comprising one or more of a 3D structures-and-physics engine, a simulation processor, or a dedicated rendering engine implemented on the single engine processing core.

13. The chip of claim 9, wherein the first positioning data, the second positioning data, the orientational data, and the virtual world system computations enable different, complementary positioning update rates.

14. The chip of claim 9, wherein the chip is configured to share computed 6 DOF positioning data through the on-chip position and communications engine using a cellular communications network or the short range communication systems.

15. A mobile computing device comprising the chip of claim 9.

16. A method comprising:
requesting, by a data tracking communications chip on a client device, wireless radio signals from one or more external positioning systems, wherein the data tracking communications chip comprises an on-chip internal positioning system;
computing, by the data tracking communications chip, an initial position of the client device using the on-chip internal positioning system, wherein the initial position of the client device is computed based at least in part on data obtained from the wireless radio signals;
refining the initial position of the client device by computing a 6 degree-of-freedom (6 DOF) position and orientation of the client device; and
updating, by the data tracking communications chip, one or more 3D applications executed by an on-chip game engine on the data tracking communications chip or an on-chip simulation engine on the data tracking communications chip, based on the computed 6 DOF position and orientation of the client device,
wherein the on-chip internal positioning engine is coupled with the on-chip game engine or the on-chip simulation engine into a single engine processing core, and wherein the on-chip internal positioning engine is dedicated to the on-chip game engine or the on-chip simulation engine such that the on-chip internal positioning engine is only used for processing data relating to the on-chip game engine or the on-chip simulation engine to which it is dedicated.

* * * * *